(12) United States Patent
Hussell

(10) Patent No.: US 8,809,880 B2
(45) Date of Patent: Aug. 19, 2014

(54) LIGHT EMITTING DIODE (LED) CHIPS AND DEVICES FOR PROVIDING FAILURE MITIGATION IN LED ARRAYS

(71) Applicant: CREE, Inc., Durham, NC (US)

(72) Inventor: Christopher P. Hussell, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/793,882

(22) Filed: Mar. 11, 2013

(65) Prior Publication Data

US 2013/0264591 A1 Oct. 10, 2013

Related U.S. Application Data

(63) Continuation-in-part of application No. 13/028,972, filed on Feb. 16, 2011, now Pat. No. 8,564,000, and a continuation-in-part of application No. 13/104,558, filed on May 10, 2011, now Pat. No. 8,624,271, and a continuation-in-part of application No. 13/282,172, filed on Oct. 26, 2011, and a continuation-in-part of application No. 13/336,540, filed on Dec. 23, 2011, now Pat. No. 8,455,908.

(60) Provisional application No. 61/656,317, filed on Jun. 6, 2012.

(51) Int. Cl.
*H01L 33/62* (2010.01)

(52) U.S. Cl.
USPC .................. 257/88; 257/91; 257/93; 257/95; 257/E31.105

(58) Field of Classification Search
CPC ....... H01L 24/15; H01L 33/60; H01L 27/153; H01L 25/167; H01L 2224/48247
USPC ........... 257/12–13, 27, 66, 69, 72, 79, 88, 89, 257/98–100, 431–433, 347, 344
See application file for complete search history.

(56) References Cited

U.S. PATENT DOCUMENTS

| | | |
|---|---|---|
| 4,855,194 A | 8/1989 | Wright |
| 4,946,547 A | 8/1990 | Palmour |
| 5,200,022 A | 4/1993 | Kong |
| RE34,861 E | 2/1995 | Davis et al. |
| 6,548,832 B1 | 4/2003 | Sakamoto et al. |

(Continued)

FOREIGN PATENT DOCUMENTS

| | | |
|---|---|---|
| CN | ZL 2011-30139847.5 | 8/2012 |
| CN | ZL 2011-30166527.9 | 8/2012 |

(Continued)

OTHER PUBLICATIONS

Bridgelux Product Data Sheet—1 page.

(Continued)

*Primary Examiner* — Dung A. Le
(74) *Attorney, Agent, or Firm* — Jenkins, Wilson, Taylor & Hunt, P.A.

(57) ABSTRACT

Light emitting diode (LED) chips and devices for providing failure mitigation in LED arrays are disclosed. In one aspect, an LED chip can include a body with an anode and a cathode in the form of electrically conductive bond pads. The anode and cathode can be configured to electrically communicate with more than two electrical components via electrical connectors.

30 Claims, 6 Drawing Sheets

(56) References Cited

U.S. PATENT DOCUMENTS

| | | |
|---|---|---|
| 7,055,987 B2 | 6/2006 | Staufert |
| D528,672 S | 9/2006 | Nagai |
| D541,761 S | 5/2007 | Saito et al. |
| 7,224,000 B2 | 5/2007 | Aanegola et al. |
| D570,506 S | 6/2008 | Uemoto |
| D570,797 S | 6/2008 | Song |
| D573,553 S | 7/2008 | Uemoto et al. |
| D573,731 S | 7/2008 | Uemoto |
| D576,576 S | 9/2008 | Shida et al. |
| 7,479,660 B2 | 1/2009 | Kobilke |
| 7,482,636 B2 | 1/2009 | Murayama et al. |
| D586,303 S | 2/2009 | Fuwa et al. |
| D589,470 S | 3/2009 | Chen |
| D591,248 S | 4/2009 | Imai et al. |
| D592,615 S | 5/2009 | Imai et al. |
| D593,043 S | 5/2009 | Song |
| D602,451 S | 10/2009 | Gielen |
| D603,813 S | 11/2009 | Nishimura et al. |
| D607,420 S | 1/2010 | Imai et al. |
| D615,051 S | 5/2010 | Chen et al. |
| D615,052 S | 5/2010 | Imai et al. |
| D618,635 S | 6/2010 | Imai et al. |
| 7,780,313 B2 | 8/2010 | Lam et al. |
| 7,825,578 B2 | 11/2010 | Takashima et al. |
| D630,171 S | 1/2011 | Hsieh |
| 7,872,418 B2 | 1/2011 | Hata et al. |
| D636,899 S | 4/2011 | Shibahara |
| D637,564 S | 5/2011 | Tseng et al. |
| D640,997 S | 7/2011 | Imai et al. |
| 7,994,518 B2 | 8/2011 | Wang et al. |
| D645,417 S | 9/2011 | Imai et al. |
| 8,044,418 B2 | 10/2011 | Loh et al. |
| 8,058,088 B2 | 11/2011 | Cannon |
| D650,760 S | 12/2011 | Hussell et al. |
| 8,119,534 B2 | 2/2012 | Tanaka et al. |
| D658,601 S | 5/2012 | Egawa et al. |
| D658,602 S | 5/2012 | Egawa et al. |
| D658,603 S | 5/2012 | Egawa et al. |
| D667,803 S | 9/2012 | Hussell et al. |
| D669,041 S | 10/2012 | Imai et al. |
| D676,000 S | 2/2013 | Hussell et al. |
| D676,395 S | 2/2013 | Hussell et al. |
| D683,708 S | 6/2013 | Sasano et al. |
| 8,455,908 B2 | 6/2013 | Welch et al. |
| D689,451 S | 9/2013 | Shimonishi et al. |
| 8,564,000 B2 | 10/2013 | Hussell |
| 8,575,639 B2 | 11/2013 | Hussell |
| 8,624,271 B2 | 1/2014 | Reiherzer |
| 2004/0196663 A1 | 10/2004 | Ishida et al. |
| 2005/0264172 A1 | 12/2005 | Wojnarowski et al. |
| 2006/0139595 A1 | 6/2006 | Koenen et al. |
| 2006/0147746 A1 | 7/2006 | Wakako et al. |
| 2006/0186418 A1 | 8/2006 | Edmond |
| 2007/0018295 A1 | 1/2007 | Kim et al. |
| 2007/0029569 A1 | 2/2007 | Andrews |
| 2007/0158668 A1 | 7/2007 | Tarsa |
| 2007/0194336 A1 | 8/2007 | Shin et al. |
| 2007/0241345 A1 * | 10/2007 | Huang ............... 257/79 |
| 2007/0246730 A1 * | 10/2007 | Oishi et al. ............ 257/99 |
| 2008/0054279 A1 | 3/2008 | Hussell et al. |
| 2008/0054284 A1 | 3/2008 | Hussell et al. |
| 2008/0054286 A1 | 3/2008 | Loh et al. |
| 2008/0089072 A1 | 4/2008 | Kim et al. |
| 2008/0106723 A1 | 5/2008 | Hoogendam et al. |
| 2008/0173884 A1 | 7/2008 | Chitnis |
| 2008/0179611 A1 | 7/2008 | Chitnis |
| 2008/0191222 A1 * | 8/2008 | Lee ................... 257/91 |
| 2008/0224166 A1 | 9/2008 | Glovatsky et al. |
| 2008/0239318 A1 | 10/2008 | Den Boef et al. |
| 2008/0258130 A1 | 10/2008 | Bergmann |
| 2009/0122514 A1 | 5/2009 | Yoon et al. |
| 2009/0261374 A1 | 10/2009 | Hayashi |
| 2009/0289169 A1 | 11/2009 | Yang et al. |
| 2009/0315061 A1 | 12/2009 | Andrews |
| 2010/0078664 A1 | 4/2010 | Helbing |
| 2010/0096642 A1 | 4/2010 | Chang et al. |
| 2010/0139836 A1 | 6/2010 | Horikoshi |
| 2010/0141182 A1 | 6/2010 | Shi |
| 2010/0155763 A1 | 6/2010 | Donofrio |
| 2010/0193822 A1 | 8/2010 | Inobe et al. |
| 2010/0253248 A1 | 10/2010 | Shi |
| 2010/0270567 A1 | 10/2010 | Emerson et al. |
| 2010/0320483 A1 | 12/2010 | Kadotani et al. |
| 2011/0068674 A1 | 3/2011 | Takenaka et al. |
| 2011/0121323 A1 | 5/2011 | Wu et al. |
| 2011/0127912 A1 | 6/2011 | Lee et al. |
| 2011/0128730 A1 | 6/2011 | Chiu |
| 2011/0291151 A1 | 12/2011 | Matsuda et al. |
| 2012/0126255 A1 | 5/2012 | Hussell et al. |
| 2012/0126257 A1 | 5/2012 | Reiherzer et al. |
| 2012/0193651 A1 | 8/2012 | Edmond |
| 2012/0205689 A1 | 8/2012 | Welch |
| 2012/0241807 A1 | 9/2012 | Hoetzl et al. |
| 2012/0299022 A1 | 11/2012 | Hussell |
| 2013/0058099 A1 | 3/2013 | Shum et al. |
| 2013/0256711 A1 * | 10/2013 | Joo et al. ............ 257/88 |

FOREIGN PATENT DOCUMENTS

| | | |
|---|---|---|
| CN | ZL201230099913.5 | 11/2012 |
| CN | ZL201230099954.4 | 12/2012 |
| CN | ZL201230099981.1 | 12/2012 |
| CN | ZL 201230472866.4 | 5/2013 |
| CN | ZL201230130915.6 | 10/2013 |
| CN | ZL201230652790.3 | 10/2013 |
| CN | ZL201230652789.0 | 11/2013 |
| CN | ZL201230652840.8 | 11/2013 |
| EP | 2327930 | 6/2011 |
| EP | 2 643 861 | 10/2013 |
| EP | 2 643 862 | 10/2013 |
| JP | 07-038940 | 9/1995 |
| JP | 10-311937 | 11/1998 |
| JP | 2001-294083 | 10/2001 |
| JP | 2005-266117 | 9/2005 |
| JP | 2006-294898 | 10/2006 |
| JP | 2007-227680 | 9/2007 |
| JP | 2007-266357 | 10/2007 |
| JP | 2007-323857 | 12/2007 |
| JP | 2007-335371 | 12/2007 |
| JP | 2009-044055 | 2/2009 |
| JP | 2009-289918 | 12/2009 |
| JP | 2010-009972 | 1/2010 |
| JP | 1476166 | 7/2013 |
| JP | 1476175 | 7/2013 |
| KR | 3004423910000 | 3/2007 |
| KR | 10-0793338 | 1/2008 |
| KR | 10-2008-0092239 | 10/2008 |
| KR | 10-2009-0011121 | 2/2009 |
| KR | 10-2011-0004632 | 1/2011 |
| TW | 113260 | 10/2006 |
| TW | 124444 | 8/2008 |
| TW | D125589 | 10/2008 |
| TW | 128526 | 5/2009 |
| TW | D141645 | 7/2011 |
| TW | D144159 | 12/2011 |
| TW | D145644 | 3/2012 |
| TW | D156539 | 10/2013 |
| WO | WO 2012/071136 | 5/2012 |
| WO | WO 2012/071138 | 5/2012 |
| WO | WO 2012/071139 | 5/2012 |
| WO | WO 2013/032737 | 3/2013 |
| WO | WO 2013/070696 | 5/2013 |
| WO | WO 2013/096431 | 6/2013 |
| WO | WO 2013/122831 | 8/2013 |

OTHER PUBLICATIONS

Citizen Co. Product Data Sheet—4 pages http://ce.citizen.co.jp/lighting_led/en/products/index.html.

U.S. Appl. No. 29/379,636 for "Light Emitting Device Package" filed Nov. 22, 2010.

Design U.S. Appl. No. 29/380,387 for "Light Emitting Device Package" filed Dec. 3, 2010.

(56) References Cited

OTHER PUBLICATIONS

U.S. Appl. No. 13/028,972 for "Light Emitting Devices and Methods" filed Feb. 16, 2011.
U.S. Appl. No. 13/104,558 for "Light Emitting Devices and Methods" filed May 10, 2011.
Notice of Allowance for U.S. Appl. No. 29/379,636 dated Aug. 4, 2011.
Design U.S. Appl. No. 29/404,913 for "Light Emitting Device Component" filed Oct. 26, 2011.
U.S. Appl. No. 13/224,850 for "Light Emitting Device Component" filed Sep. 2, 2011.
Design U.S. Appl. No. 29/379,636 for "Light Emitting Device Package" filed Nov. 22, 2011.
Design U.S. Appl. No. 29/408,955 for "Light Emitting Device Package" filed Dec. 19, 2011.
U.S. Appl. No. 13/336,540 dated Dec. 23, 2011.
Notification of Granting Patent Right for Design for Application Serial No. CN 2011/30166527.9 dated Apr. 6, 2012.
Non-Final Office Action for U.S. Appl. No. 29/380,387 dated Apr. 25, 2012.
Notification of Granting Patent Right for Design for Application Serial No. CN 2011/30139847.5 dated Apr. 26, 2012.
Notice of Allowance for U.S. Appl. No. 29/408,955 dated May 7, 2012.
Notice of Allowance for U.S. Appl. No. 29/407,084 dated May 18, 2012.
International Search Report and Written Opinion for Application Serial No. PCT/US2011/058603 dated May 23, 2012.
International Search Report and Written Opinion for Application Serial No. PCT/US2011/058601 dated May 24, 2012.
International Search Report and Written Opinion for Application Serial No. PCT/US2011/058596 dated Jun. 18, 2012.
Chinese Office Action for Application Serial No. CN 2012/30130915.6 dated Jul. 12, 2012.
Office Action/Restriction Requirement for U.S. Appl. No. 13/028,972 dated Jul. 25, 2012.
Notification of Grant for Chinese Patent Application No. 2012/30099913.5 dated Aug. 7, 2012.
Notification of Grant for Chinese Patent Application No. 2012/30099981.1 dated Aug. 17, 2012.
Notification of Grant for Chinese Patent Application No. 2012/30099954.4 dated Aug. 17, 2012.
Notice of Allowance for U.S. Appl. No. 29/407,084 dated Aug. 21, 2012.
Notice of Allowance for U.S. Appl. No. 29/380,387 dated Sep. 18, 2012.
Notice of Allowance for U.S. Appl. No. 29/408,955 dated Oct. 4, 2012.
Non-Final Office Action for U.S. Appl. No. 13/028,972 dated Oct. 10, 2012.
Chinese Office Action for Application No. CN 2012/30130915.6 dated Oct. 24, 2012.
Chinese Office Action for Application No. 201230472866.4 dated Nov. 14, 2012.
Non-Final Office Action for U.S. Appl. No. 13/104,558 dated Jan. 3, 2013.
Taiwanese Search Report for Application No. 101302309 dated Jan. 14, 2013.
Taiwanese Office Action for Application No. 101302309 dated Jan. 23, 2013.
Chinese Decision to Grant for Application No. 201230472866.4 dated Jan. 24, 2013.
Notice of Allowance for U.S. Appl. No. 13/336,540 dated Jan. 31, 2013.
Restriction Requirement for U.S. Appl. No. 13/671,089 dated Feb. 7, 2013.
Restriction Requirement for U.S. Appl. No. 29/404,913 dated Feb. 15, 2013.
Japanese Office Action for Application No. 2012-023963 dated Feb. 26, 2013.
Japanese Office Action for Application No. 2012-026117 dated Feb. 26, 2013.
Chinese Office Action for Application No. CN 2012/30130915.6 dated Feb. 27, 2013.
Notice of Allowance for U.S. Appl. No. 13/028,972 dated Feb. 28, 2013.
International Search Report and Written Opinion for Application No. PCT/US2012/051344 dated Feb. 28, 2013.
International Search Report and Written Opinion for Application No. PCT/US2012/063861 dated Mar. 18, 2013.
Non-Final Office Action for U.S. Appl. No. 13/671,089 dated Mar. 29, 2013.
Taiwanese Search Report for Application No. 102300059 dated Apr. 17, 2013.
International Search Report and Written Opinion for Application No. PCT/US2012/070589 dated Apr. 22, 2013.
Taiwanese Search Report for Application No. 102300058 dated Apr. 29, 2013.
International Search Report and Written Opinion for Application No. PCT/US2013/025307 dated May 15, 2013.
Notice of Allowance for U.S. Appl. No. 13/028,972 dated May 23, 2013.
Japanese Office Action for Application No. 2012-031549 dated Jun. 4, 2013.
Japanese Decision of Registration for Application No. 2012-023963 dated Jun. 4, 2013.
Japanese Decision of Registration for Application No. 2012-026117 dated Jun. 4, 2013.
Taiwanese Notice of Allowance for Application No. 101302309 dated Jun. 5, 2013.
Notice of Allowance for U.S. Appl. No. 13/435,912 dated Jun. 19, 2013.
Notice of Allowance for U.S. Appl. No. 29/404,913 dated Jun. 25, 2013.
Chinese Notice of Grant for Application No. 201230652790.3 dated Jun. 26, 2013.
Notice of Allowance for U.S. Appl. No. 13/104,558 dated Jul. 1, 2013.
Chinese Notice of Grant for Application No. 201230130915.6 dated Jul. 3, 2013.
Taiwanese Search Report for Application No. 102301394 dated Jul. 9, 2013.
Taiwanese Search Report for Application No. 102301395 dated Jul. 9, 2013.
Taiwanese Office Action for Application No. 102301394 dated Jul. 15, 2013.
Taiwanese Office Action for Application No. 102301395 dated Jul. 15, 2013.
Chinese Decision to Grant for Application No. 201230652789 dated Jul. 17, 2013.
Chinese Notice of Grant for Application No. 201230652840.3 dated Jul. 26, 2013.
Ex Parte Quayle Action for U.S. Appl. No. 13/671,089 dated Aug. 13, 2013.
Korean Office Action for Application No. 30-2012-0020196 dated Aug. 13, 2013.
Korean Office Action for Application No. 30-2012-0020197 dated Aug. 13, 2013.
Korean Office Action for Application No. 30-2012-0020198 dated Aug. 13, 2013.
Taiwanese Office Action for Application No. 102300058 dated Aug. 27, 2013.
Notice of Allowance for U.S. Appl. No. 13/104,558 dated Aug. 28, 2013.
Non-Final Office Action for U.S. Appl. No. 13/224,850 dated Sep. 5, 2013.
Taiwanese Office Action for Application No. 102301581 dated Sep. 6, 2013.
Taiwanese Office Action for Application No. 102301582 dated Sep. 6, 2013.
Taiwanese Office Action for Application No. 102301583 dated Sep. 6, 2013.

(56) References Cited

OTHER PUBLICATIONS

Taiwanese Office Action for Application No. 102301584 dated Sep. 6, 2013.
Taiwanese Office Action for Application No. 102301585 dated Sep. 6, 2013.
Restriction Requirement for U.S. Appl. No. 29/417,220 dated Sep. 27, 2013.
Restriction Requirement for U.S. Appl. No. 29/451,177 dated Sep. 27, 2013.
Restriction Requirement for U.S. Appl. No. 29/425,831 dated Sep. 30, 2013.
Taiwanese Office Action for Application No. 102300059 dated Oct. 1, 2013.
Chinese Notice to Grant for Application No. 201330361367.2 dated Oct. 8, 2013.
Notice of Allowance for U.S. Appl. No. 13/671,089 dated Oct. 22, 2013.
Restriction Requirement for U.S. Appl. No. 29/412,166 dated Oct. 25, 2013.
Restriction Requirement for U.S. Appl. No. 29/412,168 dated Oct. 25, 2013.
Japanese Office Action for Application No. 2012-031548 dated Nov. 5, 2013.
Japanese Office Action for Application No. 2012-031549 dated Nov. 5, 2013.
U.S. Appl. No. 11/656,759, filed Jan. 22, 2007.
U.S. Appl. No. 11/899,790, filed Sep. 7, 2007.
U.S. Appl. No. 12/014,404, filed Jan. 15, 2008.
U.S. Appl. No. 12/717,048, filed Mar. 3, 2010.
U.S. Appl. No. 11/473,089, filed Jun. 21, 2006.
Taiwanese Notice of Allowance for Application No. 102301394 dated Nov. 8, 2013.
Taiwanese Notice of Allowance for Application No. 102301395 dated Nov. 8, 2013.
Restriction Requirement for U.S. Appl. No. 13/282,172 dated Nov. 26, 2013.
Notice of Allowance for U.S. Appl. No. 29/404,913 dated Nov. 27, 2013.
Taiwanese Notice of Allowance for Application No. 102301583 dated Dec. 17, 2013.
Taiwanese Notice of Allowance for Application No. 102301581 dated Dec. 17, 2013.
Taiwanese Notice of Allowance for Application No. 102301585 dated Dec. 17, 2013.
Notice of Allowance for U.S. Appl. No. 29/412,168 dated Dec. 20, 2013.
Non-Final Office Action for U.S. Appl. No. 29/425,831 dated Dec. 24, 2013.
Notice of Allowance for U.S. Appl. No. 29/412,166 dated Dec. 24, 2013.
Non-Final Office Action for U.S. Appl. No. 29/451,177 dated Dec. 30, 2013.
Notice of Allowance for U.S. Appl. No. 29/417,220 dated Jan. 10, 2014.

* cited by examiner

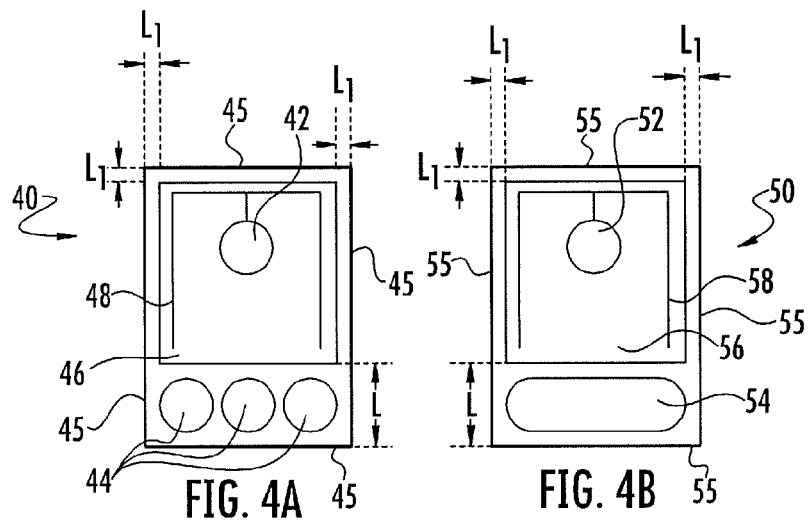
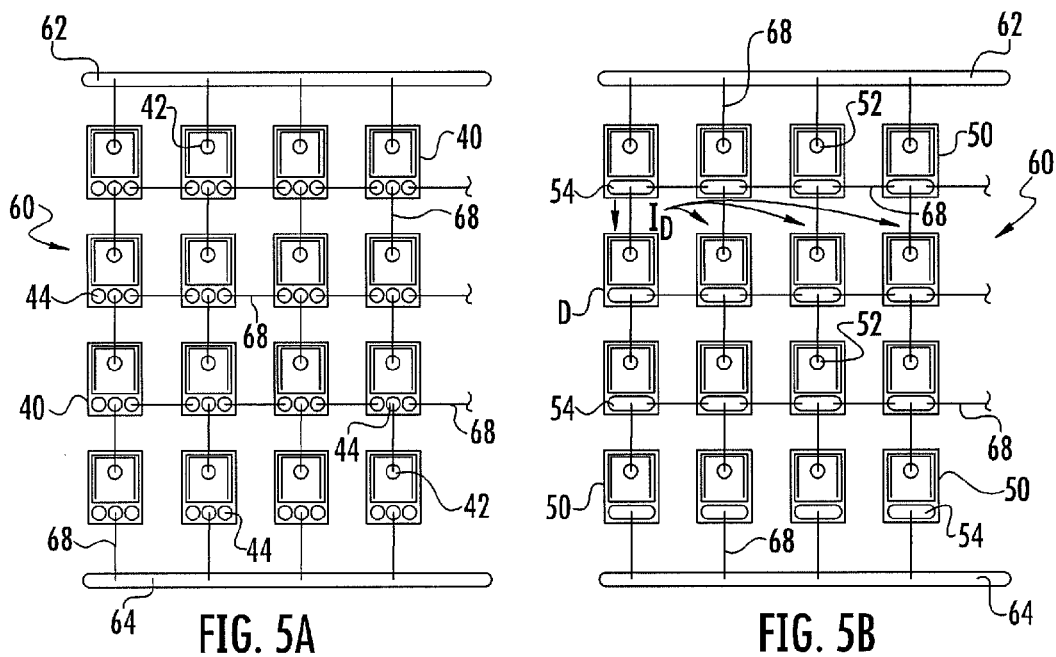
FIG. 4A  FIG. 4B
FIG. 5A  FIG. 5B

LIGHT EMITTING DIODE (LED) CHIPS AND DEVICES FOR PROVIDING FAILURE MITIGATION IN LED ARRAYS

CROSS-REFERENCE TO RELATED APPLICATIONS

This application relates and claims priority to U.S. patent application Ser. No. 61/656,317 filed Jun. 6, 2012. This application further relates and claims priority to and is a continuation-in-part of each of: U.S. patent application Ser. No. 13/028,972, filed Feb. 16, 2011; U.S. patent application Ser. No. 13/104,558, filed May 10, 2011; U.S. patent application Ser. No. 13/282,172, filed Oct. 26, 2011; and U.S. patent application Ser. No. 13/336,540, filed Dec. 23, 2011. The disclosures of each of the related applications referenced herein are incorporated by reference herein in their entireties.

TECHNICAL FIELD

The subject matter herein relates generally to light emitting diodes (LEDs). More particularly, the subject matter herein relates to LEDs, devices, and methods for providing failure mitigation in LED arrays.

BACKGROUND

Solid state light sources, such as light emitting diodes (LEDs) can be used in a variety of lighting devices, products, components, and/or fixtures for general commercial and personal lighting applications. Advantages of using LED products include an increase in energy savings and product lifetimes. For example, when LED chips or LEDs are used as the light source in components or fixtures for downlighting, backlighting, and general illumination applications, the components advantageously consume less energy than those using conventional filament light bulbs, metal halide high-intensity discharge (HID), and compact fluorescent light (CFL) bulbs.

LEDs are currently utilized in devices or packages for providing white light (e.g., perceived as being white or near-white), and are developing as replacements for incandescent, fluorescent, and metal halide high-intensity discharge (HID) devices. A representative example of an LED device comprises a device having at least one LED, a portion of which can be coated with a phosphor such as, for example, yttrium aluminum garnet (YAG). The phosphor coating can convert light emitted from one or more LEDs into white light. LEDs can emit light having desired wavelengths, and phosphor can in turn emit yellow fluorescence with a peak wavelength of about 550 nm, for example. A viewer perceives the mixture of light emissions as white light. As an alternative to phosphor converted white light, light emitting devices of red, green, and blue (RGB) wavelengths can be combined in one device or package to produce light that is perceived as white.

Traditional high quality LEDs and wirebonds can have a low failure rate on a chip by chip basis. However, the failure rate generally increases proportionally to the number of LEDs used within a given device, for example, in an LED array. For example, one high quality LED can have a 1-ppm failure rate which can increase to a 100-ppm failure rate when 100 LEDs are used in a device or component comprising a 100 LED array. This failure rate can prove unacceptably high for consumers of LED products, and may result in the catastrophic failure of devices and components incorporating LED arrays and/or a large number of LEDs within the device or component. In one aspect, a catastrophic failure of the device or component can occur where a plurality of LEDs within the device fail to emit light and/or one or more regions or areas of an LED array fail to emit light, or emit light that is substantially non-uniform.

FIG. 1A schematically illustrates a first connection method for a conventional LED array, generally designated 10. FIG. 1B is a circuit diagram of the LED array configured according to FIG. 1A. The first connection method disclosed by FIGS. 1A and 1B includes a plurality of LEDs electrically connected in series or strings between two terminals, where the series are then electrically connected in parallel between the two terminals. For example, first and second electrically conductive traces or terminals 12 and 14, also known as "bus bars" are provided which can supply electrical current to one or more LEDs 16. First and second terminals 12 and 14 can comprise electrically conductive areas or layers of material, for example, areas or layers of copper (Cu) configured to have opposing electrical polarity. First and second terminals 12 and 14 can be disposed on a mounting substrate or submount (not shown), such as a dielectric laminate, printed circuit board (PCB), or metal core printed circuit board (MCPCB). One of the first and second terminals 12 and 14, respectively, comprises an anode and the other a cathode. In one aspect, first terminal 12 comprises an anode and second terminal 14 comprises a cathode such that electrical signal or current can flow downwardly (e.g., from terminal 12 towards terminal 14, as illustrated) through the strings of LEDs 16. First and second terminals 12 and 14 can electrically communicate with a power source (not shown) which can be integrally disposed within a device incorporating LED array 10, or disposed in an external driver or driving circuit. In most cases, LEDs 16 are driven using a constant current power source.

As noted above, FIG. 1A illustrates the first connection method for producing conventional LED arrays, which comprises electrically connecting LEDs 16 in series or strings between first and second terminal 12 and 14, respectively, where the strings are parallel to each other between the terminals. LEDs 16 can be mounted to an electrically and/or conductive mounting area disposed on the substrate or submount (not shown, e.g., a mounting area of a dielectric laminate, PCB, MCPCB, etc.) such as for example, an area of Cu. Each series or string can comprise LEDs 16 electrically connected directly to each other via one or more electrically conductive connectors, such as wirebonds 18. In one aspect, wirebonds 18 comprising gold (Au) or other conductive filament can be configured for transferring electrical signal from first terminal 12, to each of the LEDs 16 within the string, where it can exit the string at the second terminal 14. In conventional arrangements, each LED 16 within a string is limited in electrical communication to at most two other LEDs 16 (or electrical component(s) such as terminals 12 and 14) via a direct wirebond 18 connection. That is, conventional LEDs 16 have two substantially small bond pads as described further below, where a first bond pad facilitates a direct electrical connection to a first adjacent LED and a second bond pad facilitates a direct electrical connection to a second adjacent LED via wirebonds 18. For illustration purposes, array 10 is illustrated as comprising four LEDs 16 electrically connected in series disposed between first and second terminals 12 and 14, where four strings are electrically connected in parallel (e.g., a 4×4 array 10). However, arrays can be formed via the first connection method using any number of strings electrically connected in parallel, and any number of LEDs 16 per string.

The first connection method illustrated by FIGS. 1A and 1B can have advantages, such as including a fewer number of wirebonds (i.e., fewer objects to block or interfere with light emission), a fewer number of design features on a mounting substrate or submount, more flexible LED arrangements upon the mounting submount (e.g., multiple ways to arrange LEDs 16 on a large, open submount), better packing density, and brighter devices in general due to less obstructions. However, this connection method has several disadvantages and can be susceptible to catastrophic failure where at least one LED 16 fails during operation. That is, conventional LEDs and conventional connecting methods can be highly sensitive to individual chip failures such that failure of as little as one LED 16 could cause LED array 10 to catastrophically fail. For example and in one aspect, LED 16 failure modes "open" or "short" LEDs 16 and can be characterized by the LEDs 16 failing to emit light when exposed to electrical current. Such failure modes can be attributed to handling defects occurring during manufacture of the LED 16 and/or array 10, defects in the electrical connection between adjacent LEDs 16 within the array 10 (e.g., broken wirebond 18), and/or defects internal the device (e.g., defects within the individual LED structure or build). LEDs 16 which go open (i.e., no current flowing through the LED 16) can cause other LEDs 16 within array 10 to take on more electrical current that becomes diverted away from the defected open LED 16. In some instances, the increased current can overload other LEDs 16 within array 10, and cause a portion of the other LEDs 16 to fail. LEDs 16 which go short (i.e., leaky LED 16) can consume more current thereby pulling in current intended for other LEDs 16 within array 10 (e.g., diverting current away from other LEDs 16 in array 10), thereby causing one or more LEDs 16 to become dim in comparison to the defective short LED. Short LEDs typically eventually go open, which can then divert current away from other LEDs 16 with array 10, and cause a portion of the other LEDs 16 to fail. Thus, short and/or open LEDs 16 occurring in the first conventional connection method (i.e., strings in parallel) can cause array 10 to catastrophically fail during operation because of a single, individual LED 16 failure. Array 10 can be highly sensitive to individual LED 16 failure rate.

The circuit diagram of FIG. 1B illustrates the effect of an open LED 16 within array 10, where the array comprises one or more strings of serially connected LEDs 16 electrically connected in parallel between first and second terminals 12 and 14, respectively. For example, incoming electrical current, designated I, can be supplied from a constant current power source and flow between first and second terminals 12 and 14. Typically, current I can be evenly distributed between the number of columns or strings within a given array. For example and as FIG. 1B illustrates, current I can be evenly distributed to the first through fourth columns of array 10 where current flowing to the first column or string is designated $I_{C1}$, current flowing to second column or string is designated $I_{C2}$, current flowing to third column or string is designated $I_{C3}$, and current flowing to fourth column or string is designated $I_{C4}$ (and so on where there are more than four columns). A defective LED or LED chip, generally designated D, is disposed in the first column and is assumed to have gone open because of a broken wirebond or other defect. As a result, no current $I_{C1}$ can flow through defective chip D. Current $I_{C1}$ must therefore be diverted away from the first column into other adjacent strings or columns as designated by the arrows. That is, current from first string $I_{C1}$ can become diverted to other strings $I_{C2}$, $I_{C3}$, and $I_{C4}$ and can result in an increased current to those strings, the increased current denoted $I_{C2+}$, $I_{C3+}$, and $I_{C4+}$. As a result, none of the other LEDs 16 within the first string below D can receive current or therefore function or illuminate because of open defective chip D. As such, the first string will have only one functioning LED 16. The initial currents $I_{C2}$, $I_{C3}$, and $I_{C4}$ of the first through fourth strings can increase to $I_{C2+}$, $I_{C3+}$, and $I_{C4+}$ by an amount expressed as C/(C−1) where C is the total number of columns or strings per array. The second, third and fourth LEDs 16 in the second through fourth strings can comprise increased currents $I_{C2+}$, $I_{C3+}$, and $I_{C4+}$ until exiting array via terminal 14, and as such, the majority of the second through fourth strings will be brighter than normal and the majority of the first string will be dark.

Depending upon the design and the number of columns or strings in array 10, this can cause a catastrophic failure of array 10 or device incorporating array 10 where current to other strings becomes too much and overloads or overburdens LEDs 16 within the other strings. For example, where a small number of strings are present (e.g., C<3) in array 10, the diverted current may be as much as two times the amount of current that the string is configured to receive. This can cause failure of the remaining string(s) within array 10 in addition to the string with the open or defective chip D. Thus, LEDs 16 within the one or more strings would fail to illuminate, and array 10, or a device incorporating array 10, would be at least partially if not totally dark thereby resulting in a catastrophic failure of array 10 as a result of the original defective chip D.

In instances where defective chip D is a short (not shown) as opposed to an open device, the initial currents $I_{C2}$, $I_{C3}$, and $I_{C4}$ become diverted from strings containing normally functioning LEDs 16 to the first string containing the short, or leaky defective chip D. As a result, $I_{C1}$ increases because more current is consumed by leaky LED chip D. The increased current can cause each of the LEDs 16 within the first string containing defective chip D to become bright compared to LEDs 16 of remaining strings (e.g., illuminated by a current reduced or diverted from $I_{C2}$, $I_{C3}$, and $I_{C4}$). Depending upon the design, this type of failure generally poses catastrophic failure risk for arrays comprising two or more strings of LEDs (e.g., C>2), as the defective string could take on as much as two or more times the amount of current it is configured to receive. This type of failure typically results in the leaky or short defective chip D finally going open, and the catastrophic failure of one or more strings of array 10 as described in FIG. 1B could result based upon the single defective chip D. However, where a large number of rows are present and because voltage increases with respect to current, other strings may continue to consume some of the current and array 10 would exhibit non-uniform and/or partially darkened illumination, which is also undesirable. Notably, for either failure mode, array 10 can catastrophically fail because of a single, individual short or open defective LED chip D, and as the number of LEDs 16 increases, the probability of defective chips D increases.

FIG. 2 schematically illustrates a conventional LED 16 which may be used in conventional arrangements or arrays of LEDs as described in FIGS. 1A, 1B (and 3A and 3B, see below). LED 16 can comprise one or more external sides 20 which can be straight-cut (i.e., substantially vertical) or beveled (i.e., substantially angled) between upper and lower surfaces of LED 16. Sides 20 of LED 16 can be substantially equal in length or can vary in length and therefore be configured to form different shapes, for example, a rectangular as illustrated. LED 16 can be fabricated on growth substrates (such as a SiC or sapphire substrate) to provide horizontal devices (i.e., with both electrical contacts on a same side of the LED) or vertical devices (i.e., with electrical contacts on opposite sides of the LED). Notably, LED 16 is limited to a direct connection with at most two other structures, for example, adjacent LEDs 16, terminals 12, 14, and/or bus bars 32 (FIGS. 3A and 3B). That is, conventional LED 16 cannot electrically communicate directly with more than two other electrical components (e.g., other LEDs, terminals, etc.) via wirebonds. As FIGS. 1A and 3A illustrate, wirebonds 18 can extend from at most two sides 20 of LED 16 and can extend in opposite directions from opposite sides 20 such that wirebonds 18 are substantially linearly aligned along a same line.

In one aspect, LED 16 can comprise a horizontal build having two electrical contacts or bond pads on the same surface of LED 16. For example, LED 16 can comprise first and second bond pads 22 and 24 of electrically opposite polarity disposed on the upper surface of LED 16. In one aspect, first bond pad 22 can comprise an anode and second bond pad 24 can comprise a cathode, where each bond pad 22 can be comprised of Au or other conductive material. Each bond pad 22 and 24 is adapted to electrically connect to at most one other adjacent LED 16. LED 16 can further comprise an active area 26 which illuminates when electrical current passes through the LED 16 via bond pads 22 and 24. In one aspect, active area 26 can comprise an InGaN junction disposed on a thermally conductive silicon carbide (SiC) substrate. Active area 26 can extend under and/or around bond pads 22 and 24 such that a portion of active area 26 is adjacent to each side 20 of the device. In one aspect, active area 26 can extend to each edge 20 uniformly, such that the length between active area 26 and each edge 20 is the same or substantially the same distance X. In one aspect, active area 26 can extend within approximately 20 μm of each edge. That is, active area 26 (along each side 20) can be approximately 40 μm smaller in overall length than each respective edge 20.

In one aspect, bond pads 22 and 24 are relatively small compared to the overall size of LED 16, as bond pads 22 and 24 are adapted to bond or electrically communicate with at most one other LED 16 or electrical component via only one wirebond 18. For example, in one aspect, first bond pad 22 can be approximately 90 μm in diameter and second bond pad 24 can be approximately 98 μm in diameter. Each bond pad 22 and 24 can comprise an area that can be approximately 5% or less than the overall chip area (calculated based on a chip having a length and width of approximately 350 μm×470 μm). Larger LEDs would have similarly sized bond pads 22 and 24 as described herein (to accommodate similarly sized wirebonds 18), thus the percentage of bond pad to overall chip area would continue to decrease below approximately 5% for larger LEDs 16. In one aspect, first bond pad 22 can comprise approximately 4% of chip area and second bond pad 24 can comprise approximately 5% of overall chip area 26 (e.g., calculated based upon a chip having a length and width of approximately 350 μm×470 μm). Thus when taken together, first and second bond pads 22 and 24 occupy approximately 9% of the overall chip area of LED 16. A current spreading structure 28 can spread current thereby distributing heat across LED 16 during operation to increase brightness by allowing LEDs 16 to run cooler. Current spreading structure 28 may also prevent failures of LEDs 16 due to thermal stresses or reduce heat related failure modes.

FIG. 3A schematically illustrates a second conventional connection method for a conventional LED array, generally designated 30. FIG. 3B is a circuit diagram for LED array 30 configured according to FIG. 3A. The second connection method disclosed by FIGS. 3A and 3B includes a series and parallel arrangement, where rows and columns are tied together at each LED chip or LED 16. That is, LED array 30 comprises four rows of LEDs 16 and four columns of LEDs 16 (e.g., a 4×4 array) disposed between first and second terminals 12 and 14. LEDs 16 of each row can be electrically connected in parallel between a terminal and intervening bus bar 32 and/or between a pair of intervening bus bars 32, where each row can be electrically connected in series with the preceding and/or subsequent row. That is, LEDs 16 within each column are serially connected via wirebonding to intervening bus bars 32 provided between the rows. This can produce a more robust array 30 in terms of failure modes attributed to open and short LEDs such as defective LED chips D, as each column and row can become less sensitized to the failure of a single defective chip D.

As illustrated, each LED 16 electrically connects directly to bus bars 32 and/or terminals 12 and 14 via wirebonds 18 as opposed to a direct electrical connection to another adjacent LED 16. First and second terminals 12 and 14 as well as intervening bus bars 32 can comprise electrically conductive areas of material, for example, areas or layers of Cu. Terminals 12 and 14 can be configured to have opposing electrical polarity. Terminals 12 and 14 and bus bars 32 can be disposed on a mounting substrate or submount (not shown), such as a PCB, MCPCB, or dielectric laminate structure. With respect to electrical polarity, intervening bus bars 32 can be configured to electrically connect LEDs in series and parallel between first and second terminals 12 and 14. Accordingly, intervening bus bars 32 can alternate in electrical polarity depending upon the arrangement of LEDs 16.

The circuit diagram of FIG. 3B illustrates the effect of an open LED within array 30, where array 30 comprises rows of LEDs 16 electrically connected in parallel, and where each row electrically connects in series via an electrical connection to intervening bus bars 32. For example, incoming electrical current, designated I, can be supplied from a constant current power source and flow between first and second terminals 12 and 14. Typically, current I can be evenly distributed between the number of columns within a given array. For example and as FIG. 3B illustrates, current I can be evenly distributed to the first through fourth columns of array 30 where current flowing to the first column is designated $I_{C1}$, current flowing to second column is designated $I_{C2}$, current flowing to third column is designated $I_{C3}$, and current flowing to fourth column is designated $I_{C4}$ (and so on where there are more than four columns). A defective LED or LED chip, generally designated D, is disposed in the second row of first column and is assumed to have gone open because of a broken wirebond or other defect. As a result, no initial current $I_{C1}$ can flow through defective chip D, where chip is open. Current $I_{C1}$ can be diverted from chip D into other LEDs 16 within the same row (i.e., LEDs 16 in adjacent columns electrically connected in parallel with chip D) as illustrated by the arrows. That is, array 30 allows current to be directed around the defective chip D such that current $I_{C1}$ thereby increases current of adjacent LED 16 as indicated by $I_{C2+}$, $I_{C3+}$, and $I_{C4+}$. The increased currents $I_{C2+}$, $I_{C3+}$, and $I_{C4+}$ can only affect LEDs 16 within the same, single row as defective chip D, as current can redistribute evenly through the four columns $I_{C1}$, $I_{C2}$, $I_{C3}$, and $I_{C4}$ beginning with the next row (i.e., third row). This can be achieved because intervening bus bar 32 can effectively push current $I_{C1}$ back into LEDs 16 within the same column as defective chip D. As a result, none of the other LEDs 16 within the same and/or adjacent rows or columns as defective chip D will lose current. Only defective chip D fails to illuminate, thereby increasing the ability of array 30 to better withstand catastrophic failure due to one defective LED chip D. However, catastrophic failure may still result as described below.

When defective chip D is open, the initial currents $I_{C2}$, $I_{C3}$, and $I_{C4}$ for LEDs 16 with the same row can increase to $I_{C2+}$, $I_{C3+}$, and $I_{C4+}$ by an amount expressed as $C/(C-1)$ where C is the total number of columns per array. Only LEDs 16 in the same row as defective chip D may be forced to undergo the higher current, and the other chips in the same column continue to function. Depending upon the design and the number of columns in array 30, this can cause a catastrophic failure of array 30 or lighting device incorporating array 30 where current to LEDs 16 within the same row as defective chip D becomes too much and overloads or overburdens the LEDs 16 in the same row as defective chip D. For example, where a small number of columns are present (e.g., C<3) in array 30, the diverted current may be as much as two times the amount of current that LEDs 16 within that row are configured to receive. This can cause failure of the LEDs 16 within the second row along with the open or defective chip D. Thus, LEDs 16 within the one or more rows would fail to illuminate, and array 30, or a device incorporating array 30, would be at least partially if not totally dark thereby resulting in a catastrophic failure as a result of the original defective chip D. Notably, array 30 which is comprised of the second connection method is more robust but still susceptible to catastrophic failure. Disadvantages of this connection method include more wirebonds (e.g., more light obstruction) and other disadvantages attributed to stationary or fixed intervening bus bars 32, for example, a reduction in mounting area available to mount LEDs 16 (e.g., because of space reserved for intervening bus bars 32). The size and permanent location of bus bars 32 further negatively affects or discourages flexible chip arrangements and the packing density of LEDs 16 within array 30. Moreover, bus bars 32 are electrical connections which are fixedly disposed on a mounting submount, which further limits LED configurations or arrangements over the submount.

In instances where defective chip D is a short (e.g., leaky LED, not shown) as opposed to an open device, more current can become diverted to chip D and other LEDs 16 within that same row (i.e., second row) to accommodate the defective chip D. Defective chip D and LEDs 16 within the same row can conduct less and become dim compared to other LEDs 16 in array 30. Depending upon the design, this type of failure generally poses catastrophic failure risk for arrays comprising two or more columns of LEDs (e.g., C>2), as the defective chip D and LEDs 16 within the same row could take on as much as two or more times the amount of current that the devices are configured to receive. This type of failure typically results in the leaky or short defective chip D finally going open, and LEDs 16 in remaining rows quickly progressing to catastrophic failure. The progression of events may be less obvious to the user, and may therefore be considered better or more robust to failure.

Despite the availability of various LEDs, devices, and methods in the marketplace, a need remains for making LED arrays more insensitive to individual chip failure rates. A need also remains for LEDs, devices, and methods allowing for more flexible arrangements of LEDs electrically connected in series and/or parallel, where such arrangements do not include one or more large, fixed or stationary bus bars.

SUMMARY

In accordance with this disclosure, novel light emitting diodes (LEDs), devices, and methods are provided that are well suited for a variety of general lighting applications. It is, therefore, an object of the present disclosure herein to provide improved LEDs, devices, and methods that are more robust to catastrophic failure during operation, and which are less sensitive to individual LED chip failures. Another object of the present disclosure is to provide LEDs, devices, and methods allowing for more flexible arrangements of LEDs electrically connected in series and/or parallel without relying on one or more bus bars that are fixed upon a device submount.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which:

FIGS. 4A and 4B are LEDs according to the disclosure herein;

FIGS. 5A and 5B are schematic views of arrays of LEDs according to the disclosure herein;

DETAILED DESCRIPTION

Figure 1A:
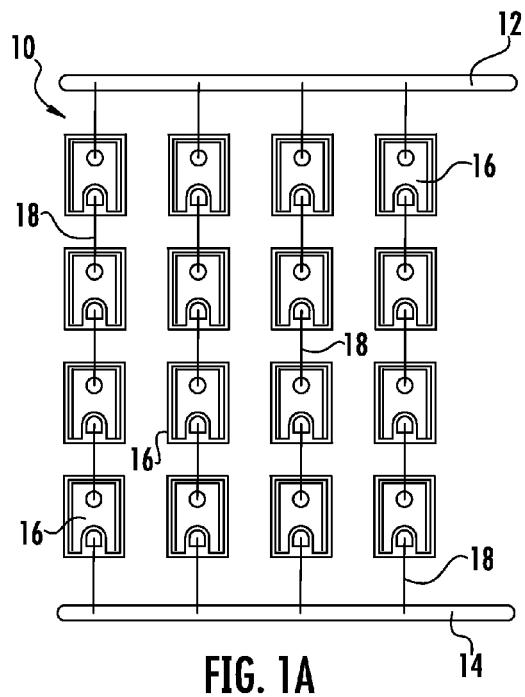
FIG. 1A is a schematic view of an array of light emitting diodes (LEDs) as known in the art.

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

Light emitting devices according to embodiments described herein may comprise group III-V nitride (e.g., gallium nitride) based light emitting diodes (LEDs) or lasers fabricated on a growth substrate, for example, a silicon carbide substrate, such as those devices manufactured and sold by Cree, Inc. of Durham, N.C. Solid state emitters, such as LEDs may also be fabricated on sapphire growth substrates. For example, Silicon carbide (SiC) substrates/layers discussed herein may be 4H polytype silicon carbide substrates/ layers. Other silicon carbide candidate polytypes, such as 3C, 6H, and 15R polytypes, however, may be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. Nos. 4,946,547; and 5,200,022, the disclosures of which are incorporated by reference herein in their entireties. Any other suitable growth substrates are contemplated herein. For example, sapphire and gallium arsenide can be utilized as growth substrates for fabricating LEDs or lasers as described herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature.

Although various embodiments of LEDs disclosed herein comprise a growth substrate, it will be understood by those skilled in the art that the crystalline epitaxial growth substrate on which the epitaxial layers comprising an LED are grown may be removed, and the freestanding epitaxial layers may be mounted on a substitute carrier substrate or substrate which may have different thermal, electrical, structural and/or optical characteristics than the original substrate. The subject matter described herein is not limited to structures having crystalline epitaxial growth substrates and may be used in connection with structures in which the epitaxial layers have been removed from their original growth substrates and bonded to substitute carrier substrates.

LEDs according to some embodiments of the present subject matter may be fabricated on growth substrates to provide horizontal devices (with both electrical contacts on a same side of the LED) or vertical devices (with electrical contacts on opposite sides of the LED). Moreover, the growth substrate may be maintained on the LED after fabrication or removed (e.g., by etching, grinding, polishing, etc.). The growth substrate may be removed, for example, to reduce a thickness of the resulting LED and/or to reduce a forward voltage through a vertical LED. A horizontal device (with or without the growth substrate), for example, may be flip chip bonded (e.g., using solder) to a carrier substrate or printed circuit board (PCB), or wire bonded. A vertical device (with or without the growth substrate) may have a first terminal solder bonded to a carrier substrate, mounting pad, or PCB and a second terminal wire bonded to the carrier substrate, electrical element, or PCB. Examples of vertical and horizontal LED chip structures are discussed by way of example in U.S. Publication No. 2008/0258130 to Bergmann et al. and in U.S. Publication No. 2006/0186418 to Edmond et al., the disclosures of which are hereby incorporated by reference herein in their entireties.

As described further, one or more LEDs can be coated, at least partially, with one or more phosphors with the phosphors absorbing at least a portion of the LED light and emitting a different wavelength of light such that the LED emits a combination of light from the LED and the phosphor. In one embodiment, the LED emits a white light which is a combination of light emission from the LED chip and phosphor. One or more LEDs can be coated and fabricated using many different methods, with one suitable method being described in U.S. patent application Ser. Nos. 11/656,759 and 11/899, 790, both entitled "Wafer Level Phosphor Coating Method and Devices Fabricated Utilizing Method", and both of which are incorporated herein by reference in their entireties. Other suitable methods for coating one or more LEDs are described in U.S. patent application Ser. No. 12/014,404 entitled "Phosphor Coating Systems and Methods for Light Emitting Structures and Packaged Light Emitting Diodes Including Phosphor Coating" and the continuation-in-part application U.S. patent application Ser. No. 12/717,048 entitled "Systems and Methods for Application of Optical Materials to Optical Elements", the disclosures of which are hereby incorporated by reference herein in their entireties. LEDs can also be coated using other methods such electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that LED devices, systems, and methods according to the present subject matter can also have multiple LEDs of different colors, one or more of which may be white emitting. Devices emitting white light and/or emitting other colors or color points are contemplated herein.

Referring now to FIGS. 4A to 7B, novel LEDs, devices, and methods are illustrated. In one aspect, LEDs, devices, and methods described herein can facilitate the novel direct electrical connection between multiple devices in combinations of series and parallel to increase robustness of LED arrays and to eliminate the need for connecting to various structures on submount surfaces (e.g. previously described bus bars). That is, LEDs, devices, and methods disclosed herein can be adapted to exhibit advantages of the previously described connection methods, while avoiding many of the disadvantages associated with conventional designs. For example, the first connection method described in FIGS. 1A and 1B can have more flexible die arrangements as the mounting substrate or submount is not limited in size and/or shape by intervening bus bars. This can result in better chip packing density and fewer design features on the submount. Disadvantages include being highly susceptible to catastrophic failure due to one LED going open or short. The second connection method described in FIGS. 3A and 3B can advantageously be more robust and/or insensitive to catastrophic failure by diverting current around open or short LEDs. However, it can have chip arrangements and packing densities confined and limited to mounting areas defined between fixed bus bars disposed on the mounting substrate or submount. LEDs, devices, and methods herein can advantageously exhibit a more robust configuration in terms of catastrophic failures due to open or short defective LEDs while allowing for flexible die arrangements and better chip packing density.

FIGS. 4A illustrates a first embodiment of an LED chip or LED, generally designated 40. In one aspect, LED 40 can comprise a body having a horizontal structure or build where more than one bond pad can be disposed on a same surface of LED 40. LED 40 can comprise a body having an anode and a cathode in the form of electrically conductive bond pads. The anode and cathode can be configured to electrically communicate with more than two electrical components via electrical connectors, such as wirebonds. Bond pads can be configured to receive and pass electrical current or signal through LED 40, thereby causing illumination of LED 40. LED 40 can comprise a body (e.g., defined by sides 45) having a first bond pad 42 of a first electrical polarity, and multiple second bond pads 44 of an opposing electrical polarity, where each second bond pad 44 is configured to have the same electrical polarity. In one aspect, first bond pad 42 comprises an anode and each of the plurality of second bond pads 44 comprises a cathode. Each of first and second bond pads 42 and 44 can be configured to send and receive electric current from other electrical components by electrically communicating with connectors, such as wires via wirebonding. That is, first and second bond pads 42 and 44 provide electrically conductive attachment surfaces to which wirebonds can attach thereby allowing LEDs 40 to electrically communicate with other electrical components (e.g., other LEDs, terminals, or bus bars). In one aspect, each bond pad 42 and 44 can electrically communicate with at least one other different LED or electrical component, such that each LED 40 is capable of electrically communicating with two or more devices. In one aspect, LED 40 is capable of electrically communicating with up to four other devices. For illustration purposes, three second bond pads 44 are illustrated, however, less than three (e.g., FIG. 4B) or more than three second bond pads 44 are contemplated herein.

LED 40 comprises multiple second bond pads 44 each having the same electrical polarity. This advantageously enables LED 40 to directly attach to and electrically communicate with more than two other LEDs, electrical terminals, bus bars, and/or combinations thereof (FIGS. 5A and 5B) whereas conventional LEDs and arrays incorporating conventional LEDs are limited to direct attachment to one or at most only two LEDs, electrical terminals, bus bars and/or combinations thereof (e.g., see FIGS. 1A and 3A). Thus, instead of electrically connecting to one or more adjacent LEDs via bonding to electrically conductive bus bars 32 that are fixedly disposed on a mounting substrate or submount as described in prior art LED devices and arrays (FIG. 3A), LED 40 can incorporate this type of bonding capability directly on the LED chip by using either multiple bond pads (e.g., second bond pads 44) and/or larger bond pads (e.g., see FIG. 4B, bond pad 54).

LED 40 can further comprise a body defined by one or more sides 45 which can be substantially equal in length, or vary in length and therefore be configured to form different shapes, for example, a rectangle as illustrated. Sides 45 can for example be straight-cut (i.e., substantially vertical) and/or beveled (i.e., substantially angled) between upper and lower surfaces of LED 40. LED 40 can comprise any size, shape, dimension, and structure (i.e., horizontal or vertical build).

Figure 2:
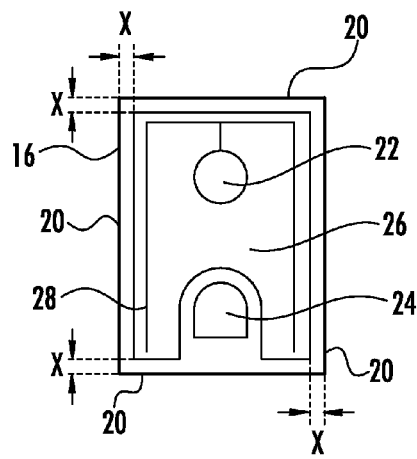
FIG. 2 is an LED as known in the art.

LED 40 can further comprise an active area 46 configured to illuminate when activated or excited by electric current. Active area 46 can be such that it does not extend around second bond pads 44 and/or uniformly extend to the same length adjacent each side 45 of LED 40 as conventional LEDs 16 typically can (see length X, FIG. 2). That is, to facilitate the direct bonding between LED 40 and more than two other adjacent LEDs or electrical components, active area 46 may need to be slightly reduced to accommodate additional and/or larger bonding surfaces, for example, multiple second bond pads 44. That is, active area 46 of LED 40 can be disposed inboard from one side a length L that is greater than the length L1 along other sides. In one aspect, active area 46 can for example comprise an area that is approximately 14% less than active area 26 of previously described conventional LED 16 (e.g., FIG. 2, which is calculated on a chip having a length and width of approximately 350 μm×470 μm). This percentage difference would decrease for LEDs 40 that are larger in size. Notably, the ability of LED 40 to bond with multiple components can allow for a tighter packing density and more flexible arrangements over a surface of a submount to offset any brightness loss that may be attributed to LEDs 40 having a smaller active area 46. In addition, a greater number of LEDs 40 can be electrically connected over a mounting surface or submount thereby advantageously taking advantage of additional mounting space available after eliminating bus bars (e.g., bus bars 32, FIG. 3A) of previously described designs.

Second bond pads 44 can comprise a diameter of approximately 90 μm which would increase the percentage of overall chip area occupied by second bond pads to approximately 12% (or less for larger LEDs). This is approximately three times the amount of area occupied by bond pad 22 (e.g., approximately 4%) of previously described conventional LED 16 (i.e., FIG. 2, calculated upon a 350×470 μm LED) as three second bond pads 44 are present as opposed to one. Accordingly, the total area occupied by first and second bond pads 42 and 44 together can for example be approximately 16% as compared to previously described devices where the bond pads 22 and 24 together occupied approximately 9% of the overall chip area (e.g., conventional LED 16 of FIG. 2, calculated based upon a 350×470 μm LED). Again, any brightness loss attributed to increasing the area of bond pads (e.g., multiple bond pads 44 which in turn decreases active area 46) can be offset by the ability to densely pack LEDs 40 across an area which can be uniform and undivided (e.g., no bus bars 32) and/or to accommodate multiple closely packed patterns because of the ability to bond LEDs 40 in combinations of series and parallel.

LED 40 can further comprise a current spreading structure 48 for spreading current thereby distributing heat across LED 40 during operation such to increase brightness by allowing LED 40 to run cooler. Current spreading structure 48 may also prevent failures of LED 40 due to thermal stresses or reduced heat related failure modes.

FIGS. 4B illustrates a second embodiment of an LED chip or LED, generally designated 50. LED 50 can comprise a body (e.g., defined by sides 55) having an anode and a cathode in the form of electrically conductive bond pads. The anode and cathode can be configured to electrically communicate with more than two electrical components via electrical connectors, such as wirebonds. LED 50 can be similar in form and function to previously described LED 40, however, the cathode can comprise one large bond pad that is provided rather than multiple second bond pads. Such bond pad can facilitate bonding or electrical communication between LED 50 and more than one other adjacent LED or electrical component. In one aspect, LED 50 can also comprise a body having a horizontal structure or build where more than one bond pad can be disposed on a same surface of LED 50. LED 50 can comprise a body comprising a first bond pad 52 of a first electrical polarity and a large second bond pad 54 of an opposing electrical polarity. In one aspect, first bond pad 52 comprises an anode and second bond pad 54 comprises a cathode. Each of first and second bond pads 52 and 54 can be configured to send and receive electrical current from other electrical components (e.g., other LEDs, terminals, bus bars) by electrically communicating via electrical connectors, such as electrically conductive wires via wirebonding. That is, first and second bond pads 52 and 54 can comprise electrically conductive attachment surfaces to which one or more electrically conductive wires can attach via any suitable wirebonding process known in the art. Wirebonding can facilitate electrical communication between more than one LED. In one aspect, bond pad 52 can electrically communicate with at least one device, and bond pad 54 can electrically communicate with more than one device. In one aspect, bond pad 54 can electrically communicate with at least other electrical components, such as three LEDs (or one terminal and two LEDs). Although not shown, multiple and/or larger anodes in the form of bond pads are also contemplated herein and can be used either alone and/or in addition to the multiple and/or larger cathodes (e.g., bond pads 44 and 54).

Notably, LED 50 can advantageously electrically communicate directly to more than two other LEDs, electrical terminals, bus bars, and/or combinations thereof (FIG. 5B) via multiple connections to large second bond pad 54. Where previous LEDs are limited to direct attachment to one or at most only two LEDs or electrical components total (e.g., via two bond pads, see FIGS. 1A and 3A), large bond pad 54 incorporates a bus bar type connection upon LED 50 surface. That is, bond pad 54 can advantageously electrically communicate with more than one adjacent LED or component where each individual bond pad of previous devices is limited to electrical connection to only one LED or component. LED 50 can comprise one or more sides 55 which can be substantially equal in length or vary in length and therefore be configured to form different shapes, for example, a rectangle as illustrated. Sides 55 can be straight-cut (i.e., substantially vertical) and/or beveled (i.e., substantially angled) between upper and lower surfaces of LED 50. LED 50 can comprise any size, shape, dimension, structure (i.e., horizontal or vertical build) as desired.

LED 50 can comprise an active area 56 configured to illuminate when activated or excited upon receipt of electrical current similar to previously described LED 40. Active area 56 can for example comprise an area that is approximately 14% less than active area 26 of previously described LED 16 (from FIG. 2 for example as calculated based upon an LED having a length and width of approximately 350 µm×470 µm). This percentage difference would decrease for LEDs 50 that are larger in size. In one aspect, active area 56 of LED 50 can be disposed inboard a greater length L along one side 55 than lengths L1 along adjacent sides 55. Notably, the ability of LED 50 to bond with multiple components can allow for a tighter packing density and more flexible arrangements over a surface of a submount to offset any brightness loss that may be attributed to LEDs 50 having a smaller active area 56. In addition, a greater number of LEDs 50 can be electrically connected over a mounting surface or submount thereby advantageously taking advantage of additional mounting space available after eliminating bus bars (e.g., bus bars 32, FIG. 3A) of previously described designs.

Second bond pad 54 can comprise an area that can be approximately the same size as the area occupied by multiple second bond pads 44 described in FIG. 4A. That is, second bond pad 54 can occupy approximately 12% of the overall chip area calculated based upon a 350×470 µm LED (or less for larger LEDs). Accordingly, first and second bond pads 52 and 54 together can occupy a total area that is approximately 16% of the area of the overall chip area as compared to previously described devices where the bond pads 22 and 24 together occupied approximately 9% of the overall chip area (e.g., conventional LED 16 of FIG. 2, calculated based upon a 350×470 µm LED). Again, any brightness loss attributed to increasing the area of bond pad 54, which in turn decreases active area 56, can be offset by the ability to densely pack LEDs 50 across an area which is uniform and undivided (e.g., no bus bars 32) and/or to accommodate multiple closely packed patterns because of the ability to bond LEDs 50 in various combinations of series and parallel. Bond pads 44 and 54 of LEDs 40 and 50 can be configured for wirebonding to two or more electrical components, wherein one or more wirebonds can be disposed orthogonal and/or angled with respect to each other.

Figure 1B:
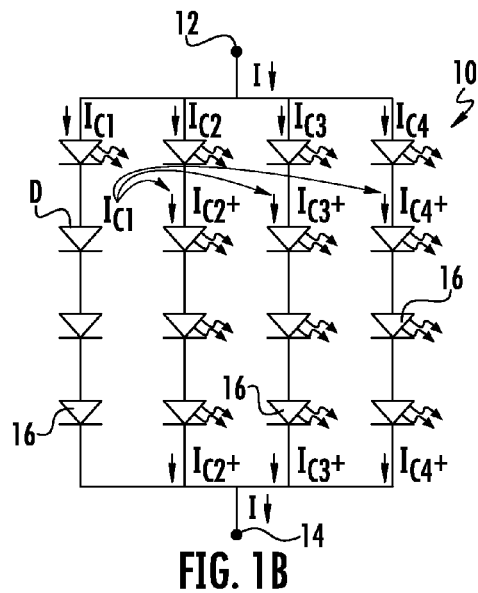
FIG. 1B is a circuit diagram of the array of LEDs shown and described in FIG. 1A.
Figure 3A:
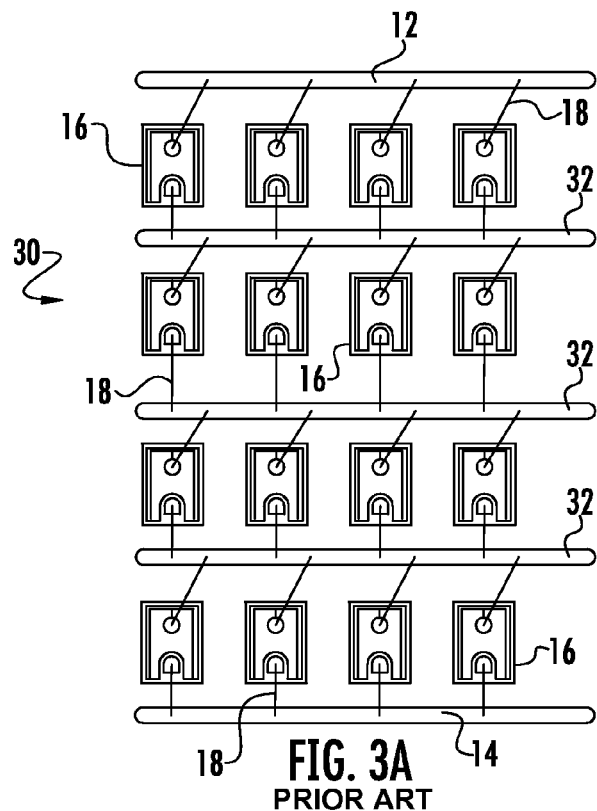
FIG. 3A is a schematic view of a second embodiment of an array of LEDs as known in the art.
Figure 3B:
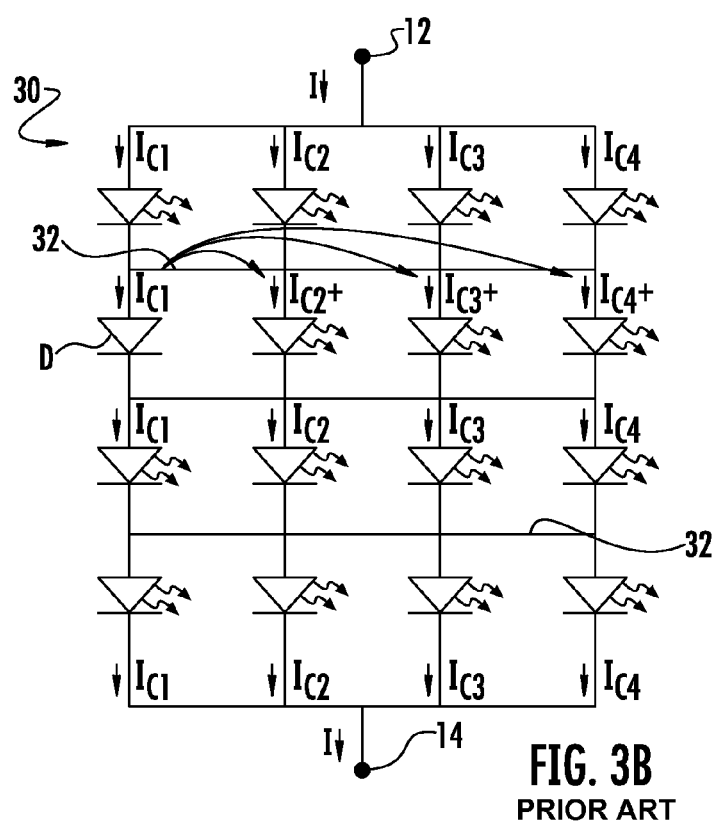
FIG. 3B is a circuit diagram of the array of LEDs shown and described in FIG. 3A.

LEDs 40 and 50 described herein can exhibit many of the previously described advantages attributed to the first and second conventional connection methods (e.g., series and series-parallel connection methods, see FIGS. 1A and 3A). For example, flexible die arrangements with improved packing density of LED chips can be achieved using LEDs 40 and 50 described herein, as arrangements and packing density no longer need to be limited to size and/or location of bus bars 32 disposed upon a mounting substrate or submount (e.g., FIG. 3A) as in conventional designs. In addition, LEDs 40 and 50 described herein can allow for combinations of series and parallel electrical connections or arrangements that are less sensitive to individual chip failure. That is, it is easier to electrically connect the novel LEDs 40 and 50 described herein in arrangements that combine series and parallel electrical connections such that electrical current can be diverted about defective open or short devices, thereby mitigating the number of LEDs 40 or 50 that become adversely affected by such defects. That is, unlike the serially connected strings of LEDs described in FIG. 1A, whole strings of dark or open LEDs can be avoided by diverting current around devices. Such current diversion can be similar to that described in FIGS. 3A and 3B, however, the novel LEDs 40 and 50 described herein can allow for current diversion that is facilitated via surfaces integrally disposed upon LEDs 40 and 50 as opposed to being limited to fixed surfaces disposed upon a mounting substrate or submount (e.g., bus bars 32, FIG. 3A). Such current diversion can mitigate catastrophic failures of LED arrays due to individual short and/or open devices.

FIGS. 5A and 5B illustrate a novel LED array, generally designated 60. LED array 60 can incorporate novel LEDs 40 and 50 described herein. Each LED array 60 can comprise an arrangement of LEDs 40 or 50 disposed on a mounting area between first and second electrically conductive terminals, 62 and 64, respectively. Each electrically conductive terminal 62 and 64 and mounting area (e.g., conductive pad 85, FIGS. 6 and 7B) can comprise an area of electrically conductive material or a layer, such as copper (Cu) disposed on a submount (e.g., 72, FIG. 7B). One or more reflection enhancement layers (e.g., dielectric layers and/or metal layers such as silver (Ag) or nickel (Ni)) can be disposed over the mounting area and terminals 62 and 64 (FIG. 7B). In one aspect, conductive terminals 62 and 64 can comprise areas of exposed metal and/or electrically conductive material integrally disposed with a submount such as a PCB, metal core printed circuit board (MCPCB), or dielectric laminate stack (e.g., FR-4 laminate stack). Terminals 62 and 64 can be configured to supply LEDs 40 or 50 with electrical current for illuminating LEDs 40 or 50. Terminals 62 and 64 can be configured to have opposing electrical polarity. For example, first terminal 62 can comprise an anode and second terminal 64 can comprise a cathode. The array 60 of LEDs 40 and 50 can electrically connect to terminals 62 and 64 via electrical conductors or wirebonds 68.

LEDs 40 and 50 can be disposed on an electrically and/or thermally conductive mounting area of submount disposed between first and second terminals 12 and 14. Notably, LEDs 40 and 50 illustrated in FIGS. 5A and 5B can electrically communicate with two or more other electrical components, including two or more adjacent LEDs, terminals 62 and 64, and/or combinations thereof. In one aspect, one or more wirebonds 68 connecting adjacent LEDS 40 or electric components can extend from an individual LED 40 orthogonally and/or angled with respect to other wirebonds 68. For example, as FIG. 5A illustrates, a given LED 40 can electrically communicate with more than two other LEDs 40 via wirebonds 68, such as three or four LEDs 40. In one aspect, a given LED 40 can communicate with at least two other LEDs 40 and/or at least one of terminals 62 and 64 via wirebonds 68. In other aspects, a given LED 40 can electrically communicate with three other LEDs 40 and at least one of terminals 62 and 64 via wirebonds 68. In further aspects, a given LED 40 can electrically communicate with four other LEDS 40 via wirebonds 68. Wirebonds 68 connecting to the four other LEDS 40 can extend from each side 45 of LED 40, where at least one wirebond 68 extending from a first side 45 of LED 40 can be orthogonal and/or angled with respect to another wirebond 68 extending from a different side 45 of LED 40. In still further aspects, a given LED 40 can electrically communicate with two other LEDs 40 and each of first and second terminals 62 and 64 via wirebonds.

Notably, array 60 can comprise rows and columns of LEDs 40, where each column and each row contains LEDs 40 electrically connected in series, and each column and/or each row can be electrically connected in parallel with other columns and rows. That is, array 60 can comprise LEDs 40 electrically connected in combinations of series and parallel arrangements. This allows electrical current to be diverted about defective LEDs 40 thereby decreasing the occurrence of catastrophic failure due to one potentially short or open LED 40. In addition, such arrangements of LEDs 40 can remain flexible and closely packed as the LEDs 40 can be connected in series and/or parallel via an increased number and/or size of bond pads disposed on LEDs 40. FIG. 5B is similar to FIG. 5A, but array 60 comprises previously described LEDs 50. As FIG. 5B illustrates, a given LED 50 can electrically communicate with more than two other LEDs 50 via wirebonds 68, such as three or four LEDs 50. In one aspect, one or more wirebonds 68 connecting adjacent LEDS 50 or electric components can extend from an individual LED 50 orthogonally and/or angled with respect to other wirebonds 68. In one aspect, a given LED 50 can communicate with at least two other LEDs 50 and/or at least one of terminals 62 and 64 via wirebonds 68. In other aspects, a given LED 50 can electrically communicate with three other LEDs 50 and at least one of terminals 62 and 64 via wirebonds 68. In further aspects, a given LED 50 can electrically communicate with four other LEDS 50 via wirebonds 68. Wirebonds 68 connecting to four adjacent LEDS 50 can extend from each side 55 of LED 50, where at least one wirebond 68 extending from a first side 55 of LED 50 can be orthogonal and/or angled with respect to another wirebond 68 extending from a different side 55 of LED 50. In still further aspects, a given LED 50 can electrically communicate with two other LEDs 50 and each of first and second terminals 62 and 64 via wirebonds. Notably, array 60 comprises rows and columns of LEDs 50, where each column and each row contains LEDs 50 electrically connected in series, and each column and/or each row can be electrically connected in parallel with other columns and rows. That is, array 60 can comprise LEDs 50 electrically connected in combinations of series and parallel arrangements. This allows electric current to be diverted about defective LEDs thereby decreasing the occurrence of catastrophic failure due to short or open LEDs.

As FIG. 5B illustrates, current $I_D$ intended for a defective device, can be diverted around a defective open LED or LED chip, generally designated D in the direction of the arrows. That is, current $I_D$ can be diverted into LEDs 50 within the same row as D. Similarly, where LED chip D is short (i.e., leaky), current can be diverted into LED chip D from LEDs 50 in the same row as D in the direction opposite that illustrated, or opposite the arrows pointing away from arrows $I_D$, as short or leaky devices consume more current. Such current diversion can allow LEDs 50 in the same row and column as LED chip D to function, or illuminate despite the short or open LED chip D. Thus, the dependency and/or sensitivity of array 60 to one defective LED chip D decreases, and array 60 can be more robust to catastrophic failures.

For illustration purposes, array 60 of FIGS. 5A and 5B comprises four rows and four columns of LEDs 40 and 50 where LEDs in each row and column are electrically connected in series, and where each column and/or row is electrically connected in parallel (e.g., a 4×4 array). However, any number of LEDs 40 or 50 and/or rows and columns is contemplated herein.

Figure 6:
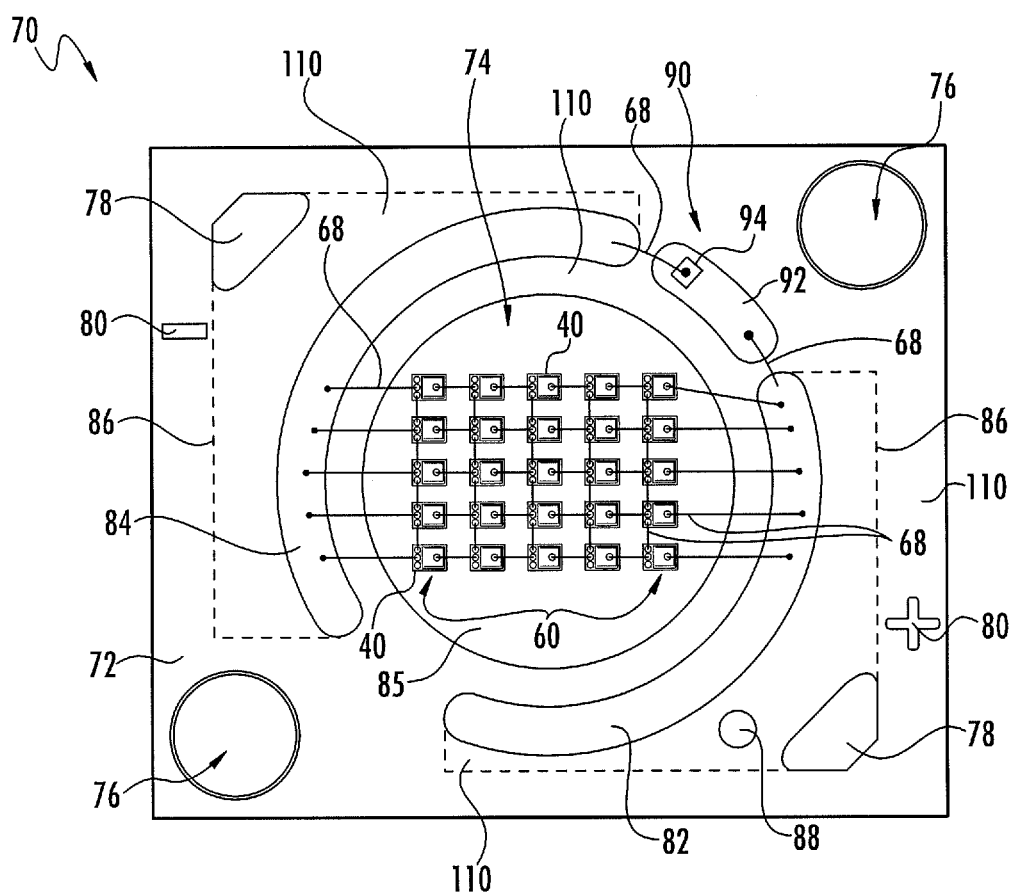
FIG. 6 is a first top view of an LED device incorporating an array of LEDs according to the disclosure herein.
Figure 7A:
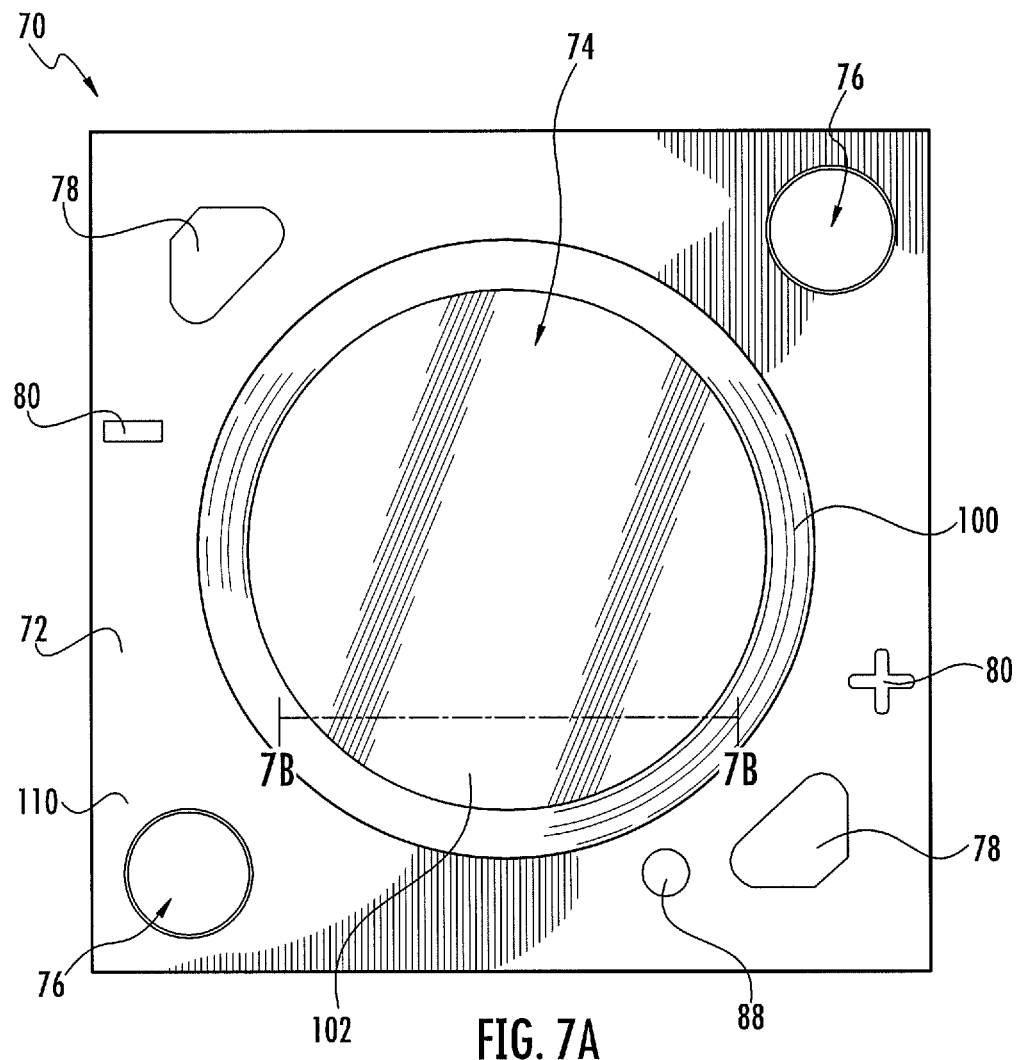
FIG. 7A is a second top view of the LED device of FIG. 6 shown and described in FIG. 6, where the array of LEDs is disposed below a filling material.
Figure 7B:
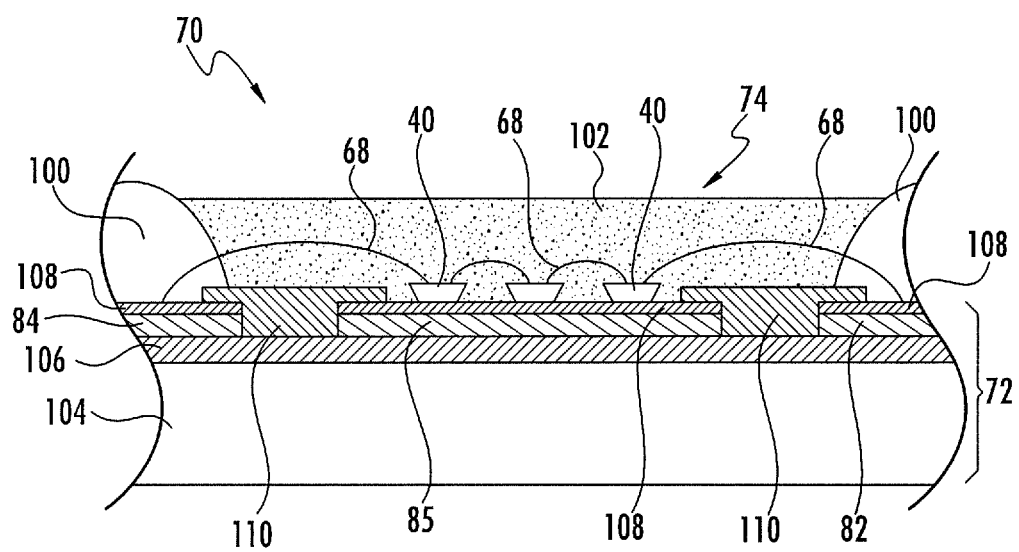
FIG. 7B is a cross-section of the LED device shown and described in FIG. 7A.

FIGS. 6 to 7B illustrate an embodiment of an LED device, generally designated 70 which incorporates novel LED array 60. LED device 70 can comprise a substrate or submount 72 over which an emission area, generally designated 74, can be disposed. Emission area 74 can comprise one or more LEDs 40 disposed under a filling material (not shown) as discussed further below. LED device 70 can comprise at least one opening or hole, generally designated 76, that can be disposed through or at least partially through submount 72 for facilitating attachment of LED device 70 to an external substrate or surface. For example, one or more screws can be inserted through the at least one hole 76 for securing device 70 to another member, structure, substrate, or surface.

LED device 70 can further comprise one or more electrical attachment surfaces 78. Attachment surfaces 78 can comprise electric contacts such as solder contacts or gas tight connectors for receiving and/or electrically connecting to one or more electrical components, for example, an electrically conductive wire (not shown). Attachment surfaces 78 can be any suitable configuration, size, shape and/or location and can comprise positive and negative electrode terminals through which an electrical current or signal can pass when connected to an external power source. In one aspect, attachment surfaces 78 can comprise gas tight connectors for electrically connecting to external electrical components without the use of solder (i.e., a 'solder free' connector or connection between surfaces 78 and electrical wire, not shown). One or more electrically conductive wires (not shown) can be attached and electrically connected to attachment surfaces 78 when welded, soldered, glued, adhered via electrically conductive tape, clamped, crimped, inserted, received, or otherwise connected via any other suitable attachment method known. For example, incoming electric current can be supplied from a constant current power source via electric wires (not shown) and flow into device 70 via surfaces 78. Indicator signs or symbols 80 can be disposed on submount 72 for denoting the electrical polarity of a given a side of LED device 70. For example, symbols 80 can comprise "+" and "−" signs denoting the side of LED device 70 comprising the positive and negative electrode terminals. Electric current or signal can pass into LED device 70 from the external wires (not shown) electrically connected to attachment surfaces 78 and into LEDs 40 via a first and second terminals. First and second terminals can comprise a first conductive trace 82 and a second conductive trace 84, respectively, to facilitate light output. First and second conductive traces 82 and 84 can be similar in form and function to previously described first and second terminals 62 and 64 (FIGS. 5A and 5B).

Attachment surfaces 78 can electrically communicate with first and second conductive traces 82 and 84 via a layer of conductive material, the size and shape of which can be configured as indicated by broken lines 86. The broken lines 86 indicate portions of electrically conductive material which can be disposed under or below one or more layers of submount 72. For example, the material bounded by broken lines 86 can comprise a portion or layer of material that is disposed under or below a layer of solder mask 110 (FIG. 7B). Attachment surfaces 78 and conductive traces 82 and 84 can comprise exposed portions of the material bounded or connected by broken lines 86 which can be exposed on the surface of submount 72 such that wirebonds 68 or electrical wires (not shown) can electrically attach or connect to such surfaces. In one aspect, attachment surfaces 78 and respective conductive traces 82 and 84 can comprise the same layer of material, such as a layer of electrically conductive Cu that integrally forms attachment surface 78 and traces 82 and 84 when portions of the material become exposed via etching or other exposure techniques. The layer of Cu forming attachment surfaces 78 and traces 82 and 84 can be plated, layered, or otherwise deposited with one or more layers of reflection enhancement material (e.g., 108 in FIG. 7B) as further described below. LEDs 40 which can be electrically connected to traces 82 and 84 via electrical connectors such as wirebonds 68. In one aspect, electrical signal can pass into device 70 via attachment surface 78 adjacent first conductive trace 82 and can flow into first conductive trace 82 and array 60 wirebonded thereto. Electric signal can pass out of array 60 via second conductive trace 84 and then out of device 70 via the respective attachment surface 78 (e.g., attachment surface 78 adjacent trace 84 comprised of material bounded or connected by the same broken lines 86).

FIG. 6 further illustrates at least one test point 88 which can be disposed on submount 72 adjacent either a positive or negative side of device 70 for testing the electrical and/or thermal properties of the LED device 70. In one aspect, test point 88 can also comprise a portion of exposed material comprised of the layer of material indicated by broken lines 86. For example, test point 88 can comprise an exposed portion of Cu where material disposed under one or more layers of submount 72 (e.g., material indicated by broken lines 86) has been exposed via etching or any other exposure technique such that test point 88 forms a portion of an upper surface of submount 72.

Emission area 74 can comprise one or more LEDs 40 disposed under a filling material (102, see FIGS. 7A and 7B). In one aspect, emission area 74 can comprise a plurality of LEDs 40 provided in an array, for example, previously described array 60. At least a first LED 40 within the array 60 can be electrically connected to two or more electrical components (e.g., adjacent LEDs, traces 82 and 84, or combinations thereof). In one aspect, a first LED 40 can comprise one or more bond pads (e.g., 44 or 54) configured to electrically connect to second and third LEDs, where the bond pads of the second and third LEDs 40 can be of the same electrical polarity (e.g., bond pad 44 or 54 can electrically connect to two anodes (e.g., 42) of adjacent second and third LEDs or two cathodes (e.g., 44) of second and third LEDs). In other aspects, a first LED 40 can electrically connect to a conductive trace 82 (or 84) and at least two other adjacent LEDs 40. The first LED 40 can electrically connect to the at least two other LEDs via electrical connectors (e.g., wirebonds 68) where the bond pads of the at least two other LEDs 40 can be of the same electrical polarity. In further aspects, a first LED 40 can electrically connect to a conductive trace 82 (or 84) and at least three other LEDs 40. The electrical trace 82 or 84 can be the same or different electrical polarity as the at least three other LEDs 40, where bond pads of the three other LEDs 40 can be of the same electrical polarity. In further aspects, a first LED 40 can electrically connect to at least four other LEDs 40 via single or multiple bond pads, where the bond pads of the at least four other LEDs 40 can be of the same electrical polarity.

Array 60 can comprise a plurality of LEDs 40 electrically connected in combinations of series and parallel arrangements, for example, LEDs 40 can be connected in a plurality of rows and columns. LEDs 40 within each row and/or column can be electrically connected in series, while at least a first row and/or column of the plurality of rows and columns can be electrically connected in parallel with the other rows and/or columns. LEDs 40 can be electrically connected to other components (e.g., adjacent LEDs, traces, and/or combinations thereof) via wirebonds 68. Wirebonds 68 can extend from different sides of an individual LED 40, up to four sides. In one aspect, one or more wirebonds 68 can extend orthogonally and/or at acute or obtuse angle with respect to other wirebonds 68. For example, for a given LED 40, a first wirebond 68 can extend from a first side in a first direction, a second wirebond 68 can extend from a second side in a second direction, a third wirebond 68 can extend from a third side in a third direction, and a fourth wirebond 68 can extend from a fourth side in a fourth direction. The first direction can be orthogonal and/or acutely or obtusely angled with respect to the second direction; the second direction can be orthogonal and/or acutely or obtusely angled with respect to the third direction; the third direction can be orthogonal and/or acutely or obtusely angled with respect to the fourth direction; and the fourth direction can be orthogonal and/or acutely or obtusely angled with respect to the first direction. Such arrangements can advantageously divert current about potentially defective LEDs 40 such that device 70 is more robust to catastrophic failure events.

Notably, LEDs 40 can be disposed over a single, undivided mounting area (e.g., conductive pad 85, described further below). Thus, there may be no extraneous or spatially limiting design features (e.g., bus bars) or isolated mounting areas (e.g., areas between bus bars) as in conventional designs (see FIG. 3A). This allows LEDs 40 to advantageously be arranged in more flexible arrangements and one or more patterns as such arrangements do not depend upon location of extra design features (e.g., bus bars, FIG. 3A). In addition, LEDs 40 can advantageously be closely packed over the single mounting area or conductive pad 85, thereby increasing light emission from device 70. Notably, LEDs 40 within device 70 can electrically connect to more than two electrical components such as adjacent LEDs 40, conductive traces 82 and 82, and/or combinations thereof. For illustration purposes, novel LEDs 40 are shown in device 70, however, device 70 could also incorporate the novel LEDs 50 shown and described in FIGS. 4B and 5B without departing from the scope of the subject matter herein. Notably, LEDs 40 (or 50) of device 70 can comprise LED chips which incorporate bus bar functionality integral to the LED 40 (or 50) in the form of multiple and/or larger bond pads (e.g., 44, FIG. 4A and/or 54, FIG. 4B).

Still referring to FIG. 6, at least one emission area 74 comprising array 60 can be substantially centrally disposed with respect to LED device 70. For illustration purposes, one centrally disposed emission area 74 is illustrated, however, emission area 74 can be disposed over any location of submount 72, for example, off-centered and/or adjacent corners or edges. Further, more than one emission area 74 is contemplated herein. For example, two or more emission areas 74 can be disposed over submount 72. Any non-circular, regular, irregular, and/or asymmetrical shape of emission area 74 is also contemplated herein. For illustration purposes, a substantially circular emission area 74 is shown, however, emission area 74 can comprise any other suitable shape, for example, any substantially square, oval, rectangular, irregular, regular, or asymmetrical shape is contemplated.

Submount 72 can comprise any suitable mounting substrate or submount, for example, a PCB, a MCPCB, an external circuit, a dielectric laminate structure, or any other suitable submount over which lighting devices such as LEDs 40 can mount and/or attach. In one aspect and for example only without limitation, submount 72 can comprise a compact dimension of 22 millimeter (mm)×22-mm square footprint. In other aspects, submount 12 can comprise any other suitable shape, for example, a circular or rectangular shape and any suitable dimension. LEDs 40 can mount or attach to a mounting area comprising a conductive pad 85 using any suitable and known die attach method and material for example, Ag epoxy, metallic solder paste, or flux. Conductive pad 85 can comprise a layer of thermally and/or electrically conductive material, for example, Cu. In one aspect, Cu may be plated, layered, or otherwise deposited with one or more layers of reflective material (e.g., 108, FIG. 7B) as described further below.

LED device 70 can further comprise elements to protect against damage from ESD. In one aspect, different elements can be used such as various vertically structured silicon (Si) Zener diodes, different LEDs arranged reverse biased to LEDs 40, surface mount varistors and lateral Si diodes. In one aspect, at least one Zener diode 94 can be disposed between ends of first and second conductive traces 82 and 84 and reversed biased with respect to LEDs 40 of array 60. Zener diode 94 can be mounted to an electrically conductive mounting surface 92 disposed between traces 82 and 84, and reverse biased with respect to traces 82 and 84 via wirebonds 68. As Zener diodes 44 are typically black and absorb light, placing the at least one Zener diode 44 between conductive traces 33 and 34 and also beneath retention material 100 (FIGS. 7A and 7B) can further improve light output intensity.

FIG. 7A illustrates device 70 where emission area 74 further comprises a filling material 102 placed, dispensed, or otherwise disposed between one or more walls of a dam or retention material 100. In one aspect, filling material 102 can comprise an encapsulant having a predetermined, or selective amount of phosphors and/or lumiphors in an amount suitable for any desired color point or light emission. Filling material 102 can interact with light emitted from the plurality of LEDs 102 such that a perceived white light, or any suitable and/or desirable wavelength of light, can be observed. Any suitable combination of encapsulant and/or phosphors can be used, and combinations of different phosphors can be used. In other aspects, filling material 102 can comprise a molded lens material. In further aspects, filling material 102 can comprise a reflector lens that can float over a layer of encapsulant disposed below the lens. Filling material 102 can be substantially opaque such that emission area 74 can be substantially opaque (as illustrated in FIG. 7A), transparent, or semi-transparent depending upon, for example, the amount and type of phosphor used.

In one aspect, retention material 100 can dispensed or otherwise positioned or placed about at least a portion of emission area 74 and over portions of conductive traces 82 and 84 of submount 72 (FIG. 7B). Dispensing retention material 100 can allow increased board space and the ability to withstand higher voltages. In some aspects, LED device 72 can be operable at 42 volts (V) or higher. After placement of retention material 100, filling material 102 can be selectively filled to any suitable level within the space disposed between one or more inner walls of retention material 100. For example, filling material 102 can be filled to a level equal to the height of retention material 100 or to any level above or below retention material 100. The level of filling material 102 can be planar or curved in any suitable manner, such as concave or convex.

Retention material 100 can comprise any suitable reflective material and can comprise a clear or opaque white material such as, for example, a silicone or epoxy material. Filler particles such as titanium dioxide ($TiO_2$), for example, can be used and added to retention material 100 for providing a reflective and opaque material. Retention material 100 can be dispensed or deposited in place using an automated dispensing machine where any suitable size and/or shape of dam can be formed. In some aspects, retention material 100 can comprise the same shape as conductive pad 85 (FIGS. 6, 7B). In other aspects, retention material 100 can comprise a different shape than conductive pad 85. Retention material 100 can be dispensed in a circular shape as shown, although any other configuration could also be provided such as, for example, a square configuration, rectangular configuration, curved configuration, irregularly shaped configuration, regularly shaped configuration, asymmetrical configuration, and/or any combination of desired configurations and/or cross-sectional shapes.

FIG. 7B illustrates a cross-sectional view of LED device 70 along the line 7B-7B of FIG. 7A. Retention material 100 can comprise a curved cross-section such that the upper surface of retention material 100 opposite submount 72 is rounded. However, any cross-sectional shape of retention material 100 is contemplated. Retention material 100 can be dispensed after wirebonding the one or more LEDs 40 such that retention material 100 is disposed over and at least partially covers wirebonds 68 to contain at least a portion, such as one end of each of wirebond 68 within retention material 100. For example, wirebonds 68 for the first and last, or outermost edge LEDs 40 for a given column or row of LEDs can be disposed within retention material 100. For illustration purposes, three LEDs 40 are illustrated as electrically connected in series (e.g., in a row or column), however, any number of LEDs 40 can be electrically connected in combinations of parallel and series as previously described, to decrease the sensitivity of array 60 (FIG. 6) to catastrophic failure caused by a single open or short device.

FIG. 7B further illustrates cross-section of submount 72 over which LEDs 40 can be provided, mounted, or otherwise arranged. Submount 72 can comprise, for example, a MCPCB such as those available and manufactured by The Bergquist Company of Chanhassan, Minn. Any suitable submount 12 can be used, however, including a dielectric laminate (e.g., FR-4) based submount or a PCB. Submount 72 can comprise a core layer 104 of electrically and/or thermally conductive material such as Cu or aluminum (Al). A dielectric layer 106 can be disposed over core layer 108. Dielectric layer 106 can comprise an electrically insulating but thermally conductive material to assist with heat dissipation through submount 72.

Submount 72 can further comprise a conductive pad 85, first and second conductive traces 82 and 84, one or more optional reflective layers 108, and solder mask 110. Conductive pad 85 and traces 82 and 84 can comprise a layer of electrically conductive Cu that can be plated or otherwise layered over dielectric layer 106. Optional reflective layer 108 can comprise a single layer or multiple thin layers of material plated or otherwise deposited over Cu components (e.g., conductive pad 85 and traces 82, 84). In one aspect, reflective layer 108 can comprise a layer of Ag. In other aspects, reflective layer 108 comprises one or more alternating layers of Ni and Ag. In further aspects, reflective layer 108 comprises one or more layers of dielectric material and/or metal layers for reflection. Reflective layer 108 can be at least partially disposed over conductive pad 85 and each of conductive traces 82 and/or 84. A layer of solder mask 110 can be deposited over Cu components (e.g., pad 85 and traces 82, 84) or reflective layer 108 where a reflective layer 108 is used. Solder mask 110 can extend into gaps disposed between conductive pad 85 and traces 82 and 84 such that conductive pad 85, traces 82 and 84, and optional reflective layer 108 form sidewalls. Solder mask 110 can be directly disposed over portions of dielectric layer 106. Solder mask 110 can also be disposed between conductive traces 33 and 34 and attachment surfaces 18 (FIG. 6) such that a layer of solder mask 110 can be disposed over the conductive material indicated by broken lines 86 (FIG. 6). Retention material 100 can be dispensed over portions of solder mask 110 and conductive traces 82 and 84 after deposition of solder mask 110. Subsequently, filling material 102 can be dispensed or positioned inside inner walls of retention material 100.

Embodiments of the present disclosure shown in the drawings and described above are exemplary of numerous embodiments that can be made within the scope of the appended claims. It is contemplated that the configurations of LEDs, devices, and methods of making the same can comprise numerous configurations other than those specifically disclosed.

What is claimed is:

1. A light emitting diode (LED) chip comprising:
a chip body comprising an anode and a cathode in the form of electrically conductive bond pads; and
wherein the anode or the cathode is configured to electrically communicate with more than two electrical components via electrical connectors, and wherein at least one of the two electrical components comprises a same electrical polarity as the anode or the cathode to which it is connected.

2. The LED chip of claim 1, wherein the anode and cathode are disposed on a same surface of the body.

3. The LED chip of claim 1, wherein the anode comprises a single bond pad and the cathode comprises a plurality of bond pads.

4. The LED chip of claim 3, wherein each bond pad of the plurality of bond pads is configured to electrically communicate with a different electrical component via electrical connectors.

5. The LED chip of claim 3, wherein the plurality of bond pads comprises a first bond pad, a second bond pad, and a third bond pad.

6. The LED chip of claim 1, wherein the LED chip is configured to emit red, green, or blue light.

7. The LED chip of claim 1, wherein the electrical components are selected from the group consisting of an adjacent LED chip, a first electrical terminal, and a second electrical terminal.

8. The LED chip of claim 1, wherein the electrical connectors comprise wirebonds.

9. The LED chip of claim 1, further comprising an active area, where the active area does not extend equally in length as measured from an edge of the LED chip.

10. The LED chip of claim 1, further comprising a first side, a second side, a third side, and a fourth side, where at least one electrical connector is configured to extend from each of the first, second, third, and fourth sides, respectively, to an adjacent electrical component.

11. The LED chip of claim 10, where at least one electrical connector extending from any of the first, second, third, and fourth sides is orthogonal with respect to another electrical connector.

12. A lighting device incorporating a plurality of the LED chips of claim 1 in an array.

13. A light emitting device comprising:
a submount; and
at least one light emitting diode (LED) chip selectively positioned at one of several locations over the submount, the at least one LED comprising:
a chip body comprising an anode and a cathode in the form of electrically conductive bond pads;
wherein either one of the anode or the cathode comprises a plurality of bond pads that are configured to electrically communicate with more than two electrical components via electrical connectors.

14. The device of claim 13, wherein the anode and cathode are disposed on a same surface of the LED chip.

15. The device of claim 13, wherein the anode comprises a single bond pad and the cathode comprises the plurality of bond pads.

16. The device of claim 15, wherein each bond pad of the plurality of bond pads is configured to electrically communicate with a different electrical component via electrical connectors.

17. The device of claim 15, wherein the plurality of bond pads comprises a first bond pad, a second bond pad, and a third bond pad.

18. The device of claim 13, wherein the LED chip is configured to emit red, green, or blue light.

19. The device of claim 13, wherein the electrical components are selected from the group consisting of an adjacent LED chip, a first electrical terminal, and a second electrical terminal.

20. The device of claim 13, wherein the electrical connectors are wirebonds.

21. The device of claim 20, further comprising a plurality of LED chips electrically connected in an array.

22. The device of claim 21, wherein the array comprises a combination LED chips electrically connected in series and parallel.

23. The device of claim 21, wherein the array comprises at least a first LED chip electrically connected to four other adjacent LED chips.

24. The device of claim 23, wherein the first LED chip comprises a first side, a second side, a third side, and a fourth side, where at least one wirebond is configured to extend from each of the first, second, third, and fourth sides, respectively, to electrically connect to the four other adjacent LED chips.

25. The device of claim 24, where the at least one wirebond extending from any of the first, second, third, and fourth sides is orthogonal with respect to another wirebond extending from a different side.

26. The device of claim 21, where the array comprises a plurality of rows and a plurality of columns, where a first row is electrically connected in parallel with a second row of the plurality of rows.

27. The device of claim 21, where the array comprises a plurality of rows and a plurality of columns of LED chips electrically connected in series, where a first column is electrically connected in parallel with a second column of the plurality of columns.

28. The device of claim 13, further comprising a retention material dispensed over the submount and at least partially over the electrical connectors.

29. The device of claim 13, further comprising a filling material disposed over the at least one LED chip.

30. The device of claim 29, wherein the filling material comprises an encapsulant having a selective amount of phosphors contained therein in an amount suitable for producing a desired color point or light emission.

\* \* \* \* \*